US012372869B2

(12) United States Patent
Kasahara et al.

(10) Patent No.: US 12,372,869 B2
(45) Date of Patent: Jul. 29, 2025

(54) METHOD FOR FORMING RESIST PATTERN AND RADIATION-SENSITIVE RESIN COMPOSITION

(71) Applicant: JSR CORPORATION, Tokyo (JP)

(72) Inventors: Kazuki Kasahara, Tokyo (JP); Katsuaki Nishikori, Tokyo (JP); Sosuke Osawa, Tokyo (JP); Miki Tamada, Tokyo (JP); Motohiro Shiratani, Tokyo (JP)

(73) Assignee: JSR CORPORATION, Tokyo (JP)

( * ) Notice: Subject to any disclaimer, the term of this patent is extended or adjusted under 35 U.S.C. 154(b) by 473 days.

(21) Appl. No.: 17/798,128

(22) PCT Filed: Jan. 12, 2021

(86) PCT No.: PCT/JP2021/000664
§ 371 (c)(1),
(2) Date: Aug. 8, 2022

(87) PCT Pub. No.: WO2021/166488
PCT Pub. Date: Aug. 26, 2021

(65) Prior Publication Data
US 2023/0103682 A1    Apr. 6, 2023

(30) Foreign Application Priority Data
Feb. 19, 2020    (JP) ................................ 2020-026009

(51) Int. Cl.
| | | |
|---|---|---|
| G03F 7/039 | (2006.01) | |
| C08F 220/18 | (2006.01) | |
| G03F 7/004 | (2006.01) | |
| G03F 7/038 | (2006.01) | |
| G03F 7/20 | (2006.01) | |

(52) U.S. Cl.
CPC ........ G03F 7/039 (2013.01); C08F 220/1805 (2020.02); C08F 220/1806 (2020.02); C08F 220/1807 (2020.02); C08F 220/1808 (2020.02); C08F 220/1809 (2020.02); C08F 220/1811 (2020.02); C08F 220/1812 (2020.02); G03F 7/0045 (2013.01); G03F 7/038 (2013.01); G03F 7/2004 (2013.01); G03F 7/2037 (2013.01)

(58) Field of Classification Search
CPC ............................... G03F 7/039; G03F 7/2037
See application file for complete search history.

(56) References Cited

U.S. PATENT DOCUMENTS

| | | | | |
|---|---|---|---|---|
| 11,703,758 B2* | 7/2023 | Shirakawa | ............ | G03F 7/0045 |
| | | | | 430/270.1 |
| 2021/0003917 A1* | 1/2021 | Hatakeyama | ........ | C09D 125/18 |
| 2024/0124635 A1* | 4/2024 | Kim | ...................... | C08F 228/06 |

FOREIGN PATENT DOCUMENTS

| | | | | |
|---|---|---|---|---|
| CN | 1975577 | A | 6/2007 | |
| CN | 113773433 | A * | 12/2021 | ............ C08F 212/12 |
| CN | 113956395 | A * | 1/2022 | |
| CN | 114957532 | A * | 8/2022 | |
| JP | 2000147777 | A | 5/2000 | |
| JP | 2013097003 | A | 5/2013 | |
| JP | 2017181639 | A | 10/2017 | |
| JP | 2019052294 | A | 4/2019 | |
| JP | 2019517025 | A | 6/2019 | |
| JP | 2019211531 | A * | 12/2019 | |
| KR | 20190010618 | A | 1/2019 | |
| TW | 201330093 | A | 7/2013 | |
| WO | WO-2019188595 | A1 | 10/2019 | |

OTHER PUBLICATIONS

Machine translation of JP 2017-181639 (no date). (Year: 0000).*
Office Action issued Jan. 23, 2025, in corresponding Japanese Patent Application No. 2022-501692 (with English translation), 5 pages.
International Search Report issued Mar. 23, 2021 in PCT/JP2021/000664, 4 pages.
Office Action issued Nov. 1, 2024, in corresponding Korean Patent Application No. 10-2022-7021586 (with machine English translation), 18 pages.
Office Action issued Aug. 8, 2024, in corresponding Japanese Patent Application No. 2022-501692 (with machine English translation), 8 pages.
English translation of the International Preliminary Report on Patentability and Written Opinion issued Sep. 1, 2022 in PCT/JP2021/000664, 8 pages.
Combined Taiwanese Office Action and Search Report issued May 20, 2024 in corresponding Taiwanese Patent Applicaiton No. 110104591 (with English translation), 20 pages.

* cited by examiner

*Primary Examiner* — Amanda C. Walke
(74) *Attorney, Agent, or Firm* — Element IP, PLC

(57) ABSTRACT

Provided are a method for forming a resist pattern that demonstrates excellent performance in sensitivity, resolution, etc. in an exposure step when a next-generation exposure technique is applied, and a radiation-sensitive resin composition. The method for forming a resist pattern includes step (1) of forming a resist film in which a content of a radiation-sensitive acid generator (C) is 0.1% by mass or less, step (2) of exposing the resist film to EUV or an electron beam (EB), and step (3) of developing the resist film exposed in the step (2).

17 Claims, No Drawings

METHOD FOR FORMING RESIST PATTERN AND RADIATION-SENSITIVE RESIN COMPOSITION

TECHNICAL FIELD

The present invention relates to a method for forming a resist pattern and a radiation-sensitive resin composition that can be used for the method.

BACKGROUND ART

A photolithography technology using a resist composition has been used for the formation of a fine circuit in a semiconductor device. As a representative procedure, for example, a resist pattern is formed on a substrate by generating an acid by irradiating a coating film of the resist composition with radiation through a mask pattern, and then reacting in the presence of the acid as a catalyst to generate a difference in the solubility of a resin into an alkaline or organic developer between an exposed area and an unexposed area.

In the photolithography technology, pattern miniaturization is promoted by using short-wavelength radiation, such as ArF excimer laser or by combining such radiation with an immersion exposure method (liquid immersion lithography). As a next-generation technology, further short-wavelength radiation, such as an electron beam, an X-ray, and EUV (extreme ultraviolet) is being utilized, and a resist material containing a styrene-based resin having enhanced radiation absorption efficiency is also being studied. (For example, Patent Document 1).

PRIOR ART DOCUMENTS

Patent Document

Patent Document 1: JP-A-2019-52294

SUMMARY OF THE INVENTION

Problems to be Solved by the Invention

Even in the above-described next-generation technology, various resist performances equal to or higher than conventional performances are required in terms of sensitivity, resolution, and the like. However, existing radiation-sensitive resin compositions do not provide sufficient levels of these properties.

An object of the present invention is to provide a radiation-sensitive resin composition capable of exhibiting sensitivity and resolution at a sufficient level when a next-generation technology is applied, and a method for forming a resist pattern.

Means for Solving the Problems

As a result of intensive studies to solve the present problems, the present inventors have found that the above object can be achieved by adopting the following configurations, and have accomplished the present invention.

That is, in one embodiment, the present invention relates to a method for forming a resist pattern, the method including:

step (1) of forming a resist film in which a content of a radiation-sensitive acid generator (C) is 0.1 mass % or less;

step (2) of exposing the resist film to EUV or an electron beam (EB); and step (3) of developing the resist film exposed in the step (2).

Since the method for forming a resist pattern of the present invention includes the step (1) of forming a resist film in which the content of the radiation-sensitive acid generator (C) is 0.1% by mass or less, sensitivity, resolution, and the like in the exposure step can be exhibited at a superior level. As a mechanism of exerting the above effect, although the scope of the right of the present invention is not necessarily limited by the following presumption, it is presumed that when the content of the radiation-sensitive acid generator (C) in the resist film is 0.1% by mass or less, uniformity is improved by simplifying the constituents of the resist film, or adverse effects on the interface between the exposed area and the unexposed area due to the acid generated during the exposure step are suppressed, resulting in improvement of various resist performances.

Further, in one embodiment of the method for forming a resist pattern according to the present invention, it is preferable that in the step (1), the resist film is formed of (A) a radiation-sensitive resin composition and the radiation-sensitive resin composition contains (A1) a resin whose solubility changes due to EUV or electron beam (EB) exposure in absence of a radiation-sensitive acid generator. Thanks to the above configuration, the resist film can function as a resist film in a conventional exposure step or the like while containing substantially no conventional radiation-sensitive acid generator (C), and as a result, various resist performances can be more reliably improved.

Further, in one embodiment of the method for forming a resist pattern according to the present invention, it is preferable that in the step (1), the resist film is formed of (A) a radiation-sensitive resin composition, and in the radiation-sensitive resin composition (A), the radiation-sensitive acid generator (C) accounts for 0.1% by mass or less based on a total amount of components other than a solvent (B). Thanks to the above configuration, a resist film substantially free of (C) a radiation-sensitive acid generator can be more easily formed, and various resist performances can be more reliably improved.

Further, in one embodiment of the method for forming a resist pattern according to the present invention, it is preferable that in the step (1), the resist film is formed of (A) a radiation-sensitive resin composition, and the radiation-sensitive resin composition (A) contains no radiation-sensitive acid generator. Thanks to the above configuration, a resist film substantially free of (C) a radiation-sensitive acid generator can be more easily formed, and various resist performances can be more reliably improved.

Further, in one embodiment of the method for forming a resist pattern according to the present invention, it is preferable that the resin whose solubility changes (A1) is a resin that changes to water-soluble or alkali-soluble. Thanks to the above configuration, various resist performances can be more reliably improved.

On the other hand, in another embodiment, the present invention relates to a radiation-sensitive resin composition containing (A2) a resin containing a group that dissociates due to EUV or electron beam (EB) exposure, (B) a solvent, and (C) a radiation-sensitive acid generator, wherein in the radiation-sensitive resin composition, the radiation-sensitive acid generator (C) accounts for 0.1% by mass or less based on a total amount of components other than the solvent (B).

Since the radiation-sensitive resin composition of the present invention contains (A2) a resin containing a group that dissociates due to EUV or electron beam (EB) exposure and in the radiation-sensitive resin composition, the radiation-sensitive acid generator (C) accounts for 0.1% by mass or less based on the total amount of the components other than the solvent (B), sensitivity, resolution, and the like in the exposure step can be exhibited at a superior level. As a mechanism of exerting the above effect, although the scope of the right of the present invention is not necessarily limited by the following presumption, it is presumed that when the content of the radiation-sensitive acid generator (C) in the radiation-sensitive resin composition is 0.1% by mass or less based on the total amount of the components other than the solvent (B), uniformity is improved by simplifying the constituents of the resist film, or adverse effects on the interface between the exposed area and the unexposed area due to the acid generated during the exposure step are suppressed, resulting in improvement of various resist performances.

In one embodiment, it is preferable that the radiation-sensitive resin composition of the present invention consists of (A2) a resin containing a group that dissociates due to EUV or electron beam (EB) exposure and (B) a solvent. Thanks to the above configuration, the resist film can function as a resist film in a conventional exposure step or the like while containing substantially no conventional radiation-sensitive acid generator (C), and as a result, various resist performances can be more reliably improved.

The radiation-sensitive resin composition of the present invention, wherein the resin containing a group that dissociates (A2) is a resin containing a group that dissociates to form a carboxylic acid structure. Thanks to the above configuration, the resist film can function as a resist film in a conventional exposure step or the like while containing substantially no conventional radiation-sensitive acid generator (C), and as a result, various resist performances can be more reliably improved.

MODE FOR CARRYING OUT THE INVENTION

Hereinbelow, embodiments of the present invention will specifically be described, but the present invention is not limited to these embodiments.
<Radiation-Sensitive Resin Composition (A)>

The radiation-sensitive resin composition (A) according to the present embodiment (hereinafter, also simply referred to as "composition") contains a prescribed resin (A0) and a prescribed solvent (B). The composition may further contain other optional components as long as the effects of the present invention are not impaired.
(Resin (A0))

The resin (A0) in the present invention is a resin that can be utilized as a resist film in an exposure step or a development step due to, for example, change in solubility in a developer by EUV, electron beam (EB) exposure, or the like even when the resin (A0) contains substantially no radiation-sensitive acid generator. By use of the resin (A0), the resin (A0) can be used as a resist film in an exposure step or a development step substantially without depending on an acid generated by exposure from an exposure radiation-sensitive acid generator as in the conventional art. Then, as a result of improving uniformity by simplifying the constituents of the resist film, or suppressing adverse effects at an interface between an exposed area and an unexposed area due to the acid generated during the exposure step, various resist performances may be improved.

In the present invention, examples of the resin (A0) include (A1) a resin whose solubility changes due to EUV or electron beam (EB) exposure in the absence of a radiation-sensitive acid generator.

In the present invention, (A1) the resin whose solubility changes due to EUV or electron beam (EB) exposure in the absence of a radiation-sensitive acid generator refers to a resin whose solubility in a developer changes due to EUV or electron beam (EB) exposure substantially without depending on an acid generated by exposure from the exposure radiation-sensitive acid generator as in the conventional art. In addition, the "solubility changes" includes a property that solubility in a developer increases or decreases.

Examples of the resin whose solubility changes (A1) include a resin that changes to water-soluble or alkali-soluble. Examples of the resin that changes to water-soluble or alkali-soluble include a resin that regenerates or generates a hydroxyl group, a carboxyl group, an amino group, an ionic group, a sulfo group, or the like in a resin structure due to exposure to light.

In the present invention, examples of the resin (A0) include (A2) a resin containing a group that dissociates due to EUV or electron beam (EB) exposure.

In the present invention, the resin containing a group that dissociates due to EUV or electron beam (EB) exposure (A2) refers to a resin containing a group that dissociates due to an elimination reaction or the like caused by EUV or electron beam (EB) exposure in a resin structure substantially without depending on an acid generated from a conventional exposure radiation-sensitive acid generator by exposure. Examples of the "group that dissociates" include a group capable of generating a hydroxyl group, a carboxyl group, an amino group, an ionic group, a sulfo group, or the like when the group dissociates due to the exposure.

Examples of the resin containing a group that dissociates due to EUV or electron beam (EB) exposure (A2) include a resin containing a group that dissociates to form a carboxylic acid structure and a resin containing a group that dissociates to form a hydroxyl group structure. Examples of the carboxylic acid structure generated by dissociation include a carboxyl group (—COOH) and a salt thereof (carboxylate group, —COO$^-$). Examples of the hydroxyl group structure generated by dissociation include an alcoholic hydroxyl group, a phenolic hydroxyl group (—OH), and a salt thereof (—O$^-$).

Examples of the resin containing a group that dissociates (A2) include a resin containing a structural unit having a group that dissociates to form a carboxylic acid structure and a structural unit having a group that dissociates to form a hydroxyl group structure. Preferable examples thereof include a resin containing a structural unit having a group that dissociates to form a carboxylic acid structure and at least one structural unit selected from a structural unit having a phenolic hydroxyl group and a structural unit having a polar group.

In one preferable example, the structural unit having a polar group includes at least one selected from among a structural unit having an alcoholic hydroxyl group, a structural unit having a lactone structure, a structural unit having a cyclic carbonate structure, and a structural unit having a sultone structure.

In the present invention, examples of the resin (A0) include an aggregate of polymers having a structural unit (a1) containing a phenolic hydroxyl group and a structural unit (a2) containing a group that dissociates due to EUV or electron beam (EB) exposure in the absence of a radiation-sensitive acid generator (hereinafter, this resin is also referred to as a "base resin").

The resin (A0) as the base resin may have another structural unit other than the structural unit (a1) and the structural unit (a2). Hereinbelow, each of the structural units will be described.

[Structural Unit (a1)]

The structural unit (a1) is a structural unit containing a phenolic hydroxyl group. When the resin (A0) has the structural unit (a1) and other structural units as necessary, the solubility thereof in a developer can be more appropriately adjusted, and as a result, various resist performances, such as sensitivity and resolution of the radiation-sensitive resin composition can be further improved. When EUV, electron beam or the like is used as radiation to be applied in an exposure step in a method for forming a resist pattern, the resin (A0) has the structural unit (a1), whereby the structural unit (a1) contributes to improvement in etching resistance and improvement in the difference in solubility in a developer (namely, dissolution contrast) between an exposed area and an unexposed area. In particular, the resin (A0) can be suitably applied to pattern formation using exposure with radiation having a wavelength of 50 nm or less such as electron beam or EUV.

Examples of the structural unit (a1) include a structural unit represented by the following formula (af).

[Formula 1]

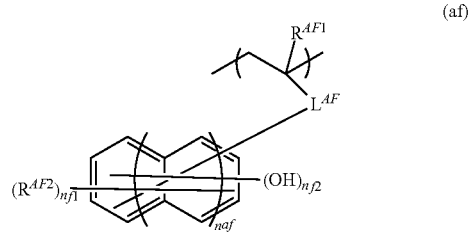

(af)

In the formula (af), $R^{AF1}$ is a hydrogen atom or a methyl group. $L^{AF}$ is a single bond, —COO—, —O—, or —CONH—. $R^{AF2}$ is a monovalent organic group having 1 to 20 carbon atoms. $n_{f1}$ is an integer of 0 to 3. When $n_{f1}$ is 2 or 3, the plurality of $R^{AF2}$s may be the same or different. $n_{f2}$ is an integer of 1 to 3. It is noted that $n_{f1}+n_{f2}$ is 5 or less. $n_{af}$ is an integer of 0 to 2.

The $L^{AF}$ is preferably a single bond or —COO—.

From the viewpoint of the copolymerizability of a monomer that affords the structural unit (a1), when the $L^{AF}$ is a single bond, the $R^{AF1}$ is preferably a hydrogen atom. When $L^{AF}$ is —COO—, the $R^{AF1}$ is preferably a methyl group.

The organic group in the resin (A0) refers to a group containing at least one carbon atom.

Examples of the monovalent organic group having 1 to 20 represented by $R^{AF2}$ include a monovalent hydrocarbon group having 1 to 20 carbon atoms, a group containing a divalent heteroatom-containing group between two adjacent carbon atoms of the foregoing hydrocarbon group or at an end located on the atomic bonding side of the foregoing hydrocarbon group, and a group obtained by substituting some or all of the hydrogen atoms of the next previous group or the foregoing hydrocarbon group with a monovalent heteroatom-containing group.

Examples of the monovalent hydrocarbon group having 1 to 20 represented by the $R^{AF2}$ include:

chain hydrocarbon groups including:
alkyl groups, such as a methyl group, an ethyl group, a propyl group, and a butyl group,
alkenyl groups, such as an ethenyl group, a propynyl group, and a butenyl group, and
alkynyl groups, such as an ethynyl group, a propynyl group, and a butynyl group;

alicyclic hydrocarbon groups including:
cycloalkyl groups, such as a cyclopropyl group, a cyclopentyl group, a cyclohexyl group, a cyclooctyl group, a norbornyl group, and an adamantyl group, and
cycloalkenyl groups, such as a cyclopropenyl group, a cyclopentenyl group, a cyclohexenyl group, and a norbornenyl group); and aromatic hydrocarbon groups including:
aryl groups, such as a phenyl group, a tolyl group, a xylyl group, a naphthyl group, and an anthryl group, and
aralkyl groups, such as a benzyl group, a phenethyl group, and a naphthylmethyl group.

As the $R^{AF2}$, chain hydrocarbon groups and cycloalkyl groups are preferable, alkyl groups and cycloalkyl groups are more preferable, and a methyl group, an ethyl group, a propyl group, a cyclopentyl group, a cyclohexyl group, a cyclooctyl group, and an adamantyl group are even more preferable.

Examples of the divalent heteroatom-containing group include —O—, —CO—, —CO—O—, —S—, —CS—, —SO$_2$—, —NR'—, and groups in which two or more of the foregoing are combined. R' is a hydrogen atom or a monovalent hydrocarbon group.

Examples of the monovalent heteroatom-containing group include halogen atoms, such as a fluorine atom, a chlorine atom, a bromine atom, and an iodine atom, a hydroxyl group, a carboxyl group, a cyano group, an amino group, and a sulfanyl group (—SH).

Among them, monovalent chain hydrocarbon groups are preferable, alkyl groups are more preferable, and a methyl group is even more preferable.

As the $n_{f1}$, integers of 0 to 2 are preferable, 0 and 1 are more preferable, and 0 is even more preferable.

As the $n_{f2}$, 1 and 2 are preferable, and 1 is more preferable.

As the $n_{af}$, 0 and 1 are preferable, and 0 is more preferable.

In the radiation-sensitive resin composition of the present invention, the structural unit (a1) may be a structural unit derived from hydroxystyrene.

As the structural unit (a1), structural units represented by the following formulas (a1-1) to (a1-6) and the like are preferable.

[Formula 2]

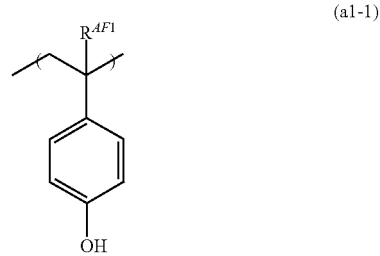

(a1-1)

(a1-2)

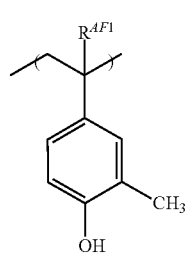

(a1-3)

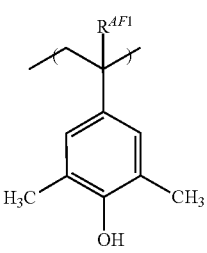

(a1-4)

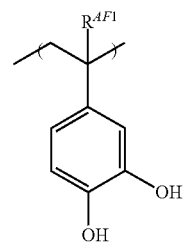

(a1-5)

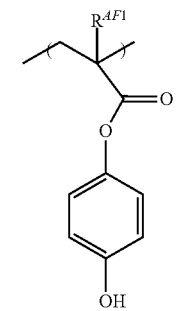

(a1-6)

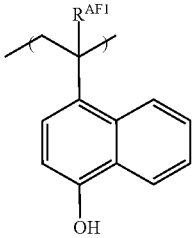

In the formulas (a1-1) to (a1-6), $R^{AF1}$ is the same as that in the formula (af).

Among them, the structural units (a1-1) and (a1-2) are preferable, and the structural unit (a1-1) is more preferable.

Regarding the structural unit (a1) in the resin (A0), the lower limit of the content of the structural unit (a1) is preferably 10 mol %, more preferably 15 mol %, even more preferably 20 mol %, and particularly preferably 25 mol % based on all the structural units constituting the resin (A0). The upper limit of the content is preferably 90 mol %, more preferably 80 mol %, even more preferably 70 mol %, and particularly preferably 60 mol %. When the content of the structural unit (a1) is adjusted to within the above range, the radiation-sensitive resin composition can be further improved in various resist performances, such as sensitivity and resolution.

When a monomer having a phenolic hydroxyl group, such as hydroxystyrene is directly radically polymerized, the polymerization may be inhibited under the influence of the phenolic hydroxyl group. In this case, the structural unit (a1) can be obtained by polymerizing the monomer in a state where the phenolic hydroxyl group is protected by a protecting group, such as an alkali-dissociable group, and then deprotecting the polymerized product by hydrolysis. The structural unit which affords the structural unit (a1) by hydrolysis is preferably represented by the following formula (1).

[Formula 3]

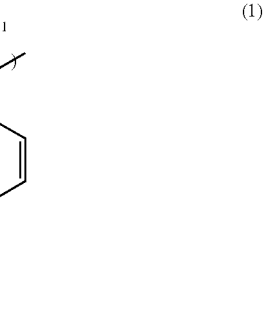

(1)

In the above formula (1), $R^{11}$ is a hydrogen atom, a fluorine atom, a methyl group, or a trifluoromethyl group. $R^{12}$ is a monovalent hydrocarbon group having 1 to 20 carbon atoms or an alkoxy group. Examples of the monovalent hydrocarbon group having 1 to 20 carbon atoms as $R^{12}$ include monovalent hydrocarbon groups having 1 to 20 carbon atoms. Examples of the alkoxy group include a methoxy group, an ethoxy group, and a tert-butoxy group.

As the $R^{12}$, alkyl groups and alkoxy groups are preferable, and among them, a methyl group and a tert-butoxy group are more preferable.

[Structural Unit (a2)]

The structural unit (a2) is a group whose solubility changes due to EUV or electron beam (EB) exposure in the absence of a radiation-sensitive acid generator, a group that dissociates due to EUV or electron beam (EB) exposure in the absence of a radiation-sensitive acid generator, or the like.

In the present invention, the phrase "in the absence of a radiation-sensitive acid generator" refers to a situation in which no or substantially no radiation-sensitive acid generator is present. Examples of the structural unit (a2) include a structural unit having a tertiary alkyl ester moiety, a structural unit having a structure in which a hydrogen atom of a phenolic hydroxyl group is substituted with a tertiary alkyl group, and a structural unit having an acetal bond. From the viewpoint of improving the patternability of the radiation-sensitive resin composition, a structural unit represented by the following formula (2) (hereinafter, also referred to as "structural unit (a2-1)") is preferable.

The structural units mentioned as examples in the preceding paragraph are structures known as acid-dissociable groups in the present technical field. In the present invention, the "acid-dissociable group" refers to a group that substitutes for a hydrogen atom of a carboxy group, a phenolic hydroxyl group, an alcoholic hydroxyl group, a sulfo group, or the like, and has a property of being dissociated by the action of an acid. As described above, in the present invention, the presence of an acid during the exposure step or the occurrence of change in solubility or dissociation, such as elimination of the structural unit (a2) caused by an acid generated from a radiation-sensitive acid generator by exposure is not required. The radiation-sensitive resin composition is superior in patternability because the resin has the structural unit (a2).

[Formula 4]

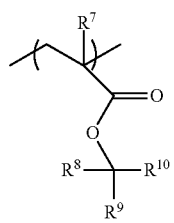

(2)

In the above formula (2), $R^7$ is a hydrogen atom, a fluorine atom, a methyl group, or a trifluoromethyl group. $R^8$ is a hydrogen atom or a monovalent hydrocarbon group having 1 to 20 carbon atoms. $R^9$ and $R^{10}$ each independently represent a monovalent chain hydrocarbon group having 1 to 20 carbon atoms which is substituted or unsubstituted with a fluorine atom, a monovalent alicyclic hydrocarbon group having 3 to 20 carbon atoms which is substituted or unsubstituted with a fluorine atom, a monovalent aromatic hydrocarbon group having 5 to 20 carbon atoms, or a divalent alicyclic group having 3 to 20 carbon atoms which is substituted or unsubstituted with a fluorine atom and is constituted by the foregoing groups combined with each other together with a carbon atom to which these groups are bonded. Any of $R^8$ to $R^{10}$ and/or the alicyclic group when present may have an unsaturated bond. In addition, a case where any two or more of $R^8$ to $R^{10}$ together form one alicyclic structure is also included.

From the viewpoint of the copolymerizability of a monomer that affords the structural unit (a2-1), as the $R^7$, a hydrogen atom and a methyl group are preferable, and a methyl group is more preferable.

Examples of the monovalent hydrocarbon group having 1 to 20 carbon atoms represented by the $R^8$ include chain hydrocarbon groups having 1 to 10 carbon atoms, monovalent alicyclic hydrocarbon groups having 3 to 20 carbon atoms, and monovalent aromatic hydrocarbon groups having 6 to 20 carbon atoms.

Examples of the monovalent chain hydrocarbon group having 1 to 20 carbon atoms represented by $R^9$ and $R^{10}$ include linear or branched saturated hydrocarbon groups having 1 to 20 carbon atoms and linear or branched unsaturated hydrocarbon groups having 1 to 20 carbon atoms.

Examples of the monovalent alicyclic hydrocarbon group having 3 to 20 carbon atoms represented by $R^9$ and $R^{10}$ include monocyclic or polycyclic saturated hydrocarbon groups and monocyclic or polycyclic unsaturated hydrocarbon groups. As the monocyclic saturated hydrocarbon group, a cyclopentyl group, a cyclohexyl group, a cycloheptyl group, and a cyclooctyl group are preferable. As a polycyclic cycloalkyl group, bridged alicyclic hydrocarbon groups, such as a norbornyl group, an adamantyl group, a tricyclodecyl group, and a tetracyclododecyl group are preferable. The bridged alicyclic hydrocarbon group refers to a polycyclic alicyclic hydrocarbon group in which two carbon atoms that are not adjacent to each other among the carbon atoms constituting an alicyclic ring are bonded by a bond chain containing one or more carbon atoms.

Examples of the monovalent aromatic hydrocarbon group having 5 to 20 carbon atoms represented by $R^9$ and $R^{10}$ include aryl groups, such as a phenyl group, a tolyl group, a xylyl group, a naphthyl group, and an anthryl group; and aralkyl groups, such as a benzyl group, a phenethyl group, and a naphthylmethyl group.

As the $R^8$, linear or branched saturated hydrocarbon groups having 1 to 10 carbon atoms and alicyclic hydrocarbon groups having 3 to 20 carbon atoms are preferable.

Any of $R^8$ to $R^{10}$ and/or the alicyclic group when present may have an unsaturated bond.

In addition, a case where any two or more of $R^8$ to $R^{10}$ together form one alicyclic structure is also included.

When two or more among the $R^8$ to $R^{10}$ are combined with each other and have at least one cyclic structure, the divalent alicyclic group having 3 to 20 carbon atoms composed of chain hydrocarbon groups or alicyclic hydrocarbon groups combined with each other, together with a carbon atom to which these groups are bonded is not particularly limited as long as it is a group formed by removing two hydrogen atoms from one carbon atom contained in a carbon ring of a monocyclic or polycyclic hydrocarbon having the aforementioned number of carbon atoms. The group may be either a monocyclic hydrocarbon group or a polycyclic hydrocarbon group, and the polycyclic hydrocarbon group may be either a bridged alicyclic hydrocarbon group or a fused alicyclic hydrocarbon group, and may be either a saturated hydrocarbon group or an unsaturated hydrocarbon group. It is to be noted that the fused alicyclic hydrocarbon group refers to a polycyclic alicyclic hydrocarbon group in which two or more alicyclic rings share a side (a bond between two adjacent carbon atoms).

Among the monocyclic alicyclic hydrocarbon groups, as the saturated hydrocarbon group, a cyclopentanediyl group, a cyclohexanediyl group, a cycloheptanediyl group, a cyclooctanediyl group, and the like are preferable, and as the unsaturated hydrocarbon group, a cyclopentenediyl group, a cyclohexenediyl group, a cycloheptenediyl group, a cyclooctenediyl group, a cyclodecenediyl group, and the like are preferable. As the polycyclic alicyclic hydrocarbon group, bridged alicyclic saturated hydrocarbon groups are preferable, and for example, a bicyclo[2.2.1]heptane-2,2-diyl group (norbornane-2,2-diyl group), a bicyclo[2.2.2]octane-2,2-diyl group, and a tricyclo[3.3.1.1$^{3,7}$]decane-2,2-diyl group (adamantane-2,2-diyl group) are preferable.

Examples of the divalent linking group represented by $L^1$ include alkanediyl groups, cycloalkanediyl groups, alkenediyl groups, *—$R^{LA}$O—, and *—$R^{LB}$COO— (* represents a bond on the oxygen side). Some or all of the hydrogen atoms contained in these groups may be substituted with a fluorine atom, a hydroxyl group, a carboxyl group, an amino group, a cyano group, or the like.

As the alkanediyl group, alkanediyl groups having 1 to 8 carbon atoms are preferable.

Examples of the cycloalkanediyl groups include monocyclic cycloalkanediyl groups, such as a cyclopentanediyl group and a cyclohexanediyl group; and polycyclic cycloalkanediyl groups, such as a norbornanediyl group and an adamantanediyl group. As the cycloalkanediyl group, cycloalkanediyl groups having 5 to 12 carbon atoms are preferable.

Examples of the alkenediyl groups include an ethenediyl group, a propenediyl group, and a butenediyl group. As the alkenediyl group, alkenediyl groups having 2 to 6 carbon atoms are preferable.

Examples of $R^{LA}$ of $*-R^{LA}O-$ include the alkanediyl groups described above, the cycloalkanediyl groups described above, and the alkenediyl groups described above. Examples of the $R^{LB}$ of $*-R^{LB}COO-$ include the alkanediyl groups described above, the cycloalkanediyl groups described above, the alkenediyl groups described above, and the arenediyl groups described above. Examples of the arenediyl groups include a phenylene group, a tolylene group, and a naphthylene group. As the arenediyl groups, arenediyl groups having 6 to 15 carbon atoms are preferable.

Among them, it is preferable that $R^8$ is an alkyl group having 1 to 4 carbon atoms and the alicyclic structure constituted by $R^9$ and $R^{10}$ combined with each other and the carbon atom to which the $R^9$ and $R^{10}$ are bonded is a polycyclic or monocyclic cycloalkane structure. $L^1$ is preferably a single bond or $*-R^{LA}O-$. As the $R^{LA}$, alkanediyl groups are preferable.

Examples of the structural unit (a2-1) include structural units represented by the following formulas (2-1) to (2-6) (hereinafter, also referred to as "structural units (a2-1-1) to (a2-1-6)").

[Formula 5]

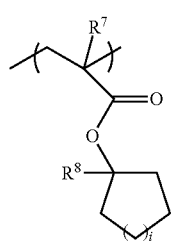

(2-1)

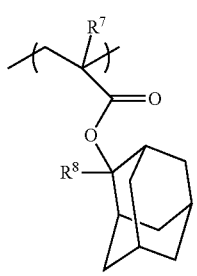

(2-2)

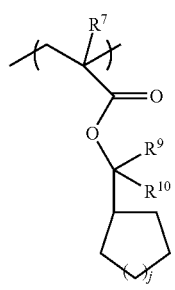

(2-3)

[Formula 6]

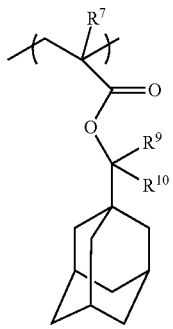

(2-4)

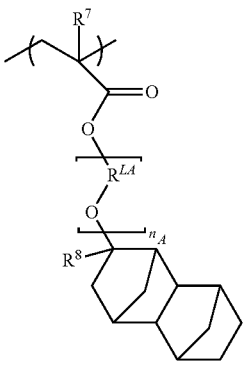

(2-5)

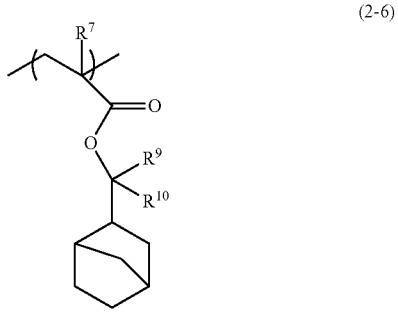

(2-6)

In the above formulas (a2-1-1) to (a2-1-6), $R^7$ to $R^{10}$ are the same as those in the above formula (2). i and j are each independently an integer of 1 to 4. The cycloalkyl ring in the formula (a2-1-3) may be substituted with a halogen atom.

In the above formulas (a2-1-5) to (a2-1-6), $n_A$ is 0 or 1.

As i and j, 1 is preferable. As $R^8$ to $R^{10}$, a methyl group, an ethyl group, an isopropyl group, a t-butyl group, or a phenyl group is preferable.

Examples of the structural unit (a2-1) also include structural units represented by the following formulas (2-7) to (2-8) (hereinafter, also referred to as "structural units (a2-1-7) to (a2-1-8)").

[Formula 7]

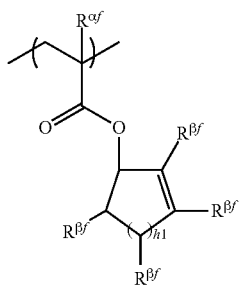
(2-7)

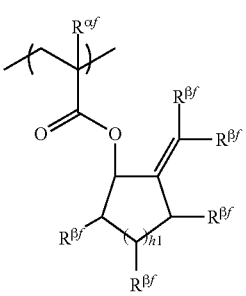
(2-8)

In the above formulas (2-7) to (2-8), $R^{\alpha f}$s are each independently a hydrogen atom, a fluorine atom, a methyl group, or a trifluoromethyl group. $R^{\beta f}$s are each independently a hydrogen atom or a chain alkyl group having 1 to 5 carbon atoms. $h_1$ is an integer of 1 to 4.

As the $R^{\beta f}$, a hydrogen atom, a methyl group, or an ethyl group is preferable. As $h_1$, 1 or 2 is preferable.

Further, two or more $R^{\beta f}$s may together form one alicyclic structure. In one example, two $R^{\beta f}$s together forms one cyclohexane structure or benzene ring structure.

As the structural unit (a2-1), among these structural units, the structural unit (a2-1-1) and the structural units (a2-1-2), (a2-1-3), (a2-1-4), and (a2-1-7) are preferable, and a structural unit having a 1-alkylcycloalkyl group, a structural unit having a 1-arylcycloalkyl group, a structural unit having a cycloalkenyl group, a structural unit having a 1-alkyladamantyl group, a structural unit having an arylalkyl group, and a structural unit having a substituted or unsubstituted cycloalkylalkyl group are more preferable.

The resin (A0) may contain either one type of structural unit (a2) or two or more types of structural units (a2) in combination.

The lower limit of the content of the structural unit (a2) is preferably 10 mol %, more preferably 15 mol %, even more preferably 20 mol %, and particularly preferably 30 mol % based on all the structural units constituting the resin (A0), which is a base resin. The upper limit of the content is preferably 90 mol %, more preferably 80 mol %, even more preferably 75 mol %, and particularly preferably 70 mol %. When the content of the structural unit (a2) is adjusted to within the above range, the patternability of the radiation-sensitive resin composition can be further improved.

[Structural Unit (a3)]

The structural unit (a3) is a structural unit containing a lactone structure, a cyclic carbonate structure, a sultone structure, or a combination thereof. When the resin (A0) further has the structural unit (a3) in addition to the structural unit (a1) and the structural unit (a2), the polarity can be moderate. As a result, the radiation-sensitive resin composition can form a resist pattern finer and superior in rectangularity of a cross-sectional shape as a chemically amplified resist material. Here, the lactone group refers to a structure having one ring (lactone ring) containing a group represented by —O—C(O)—. The cyclic carbonate structure refers to a structure having one ring (cyclic carbonate ring) containing a group represented by —O—C(O)—O—. The sultone structure refers to a structure having one ring (sultone ring) containing a group represented by —O—S(O)$_2$—.

Examples of the structural unit (a3) include a structural unit represented by the following formula.

[Formula 8]

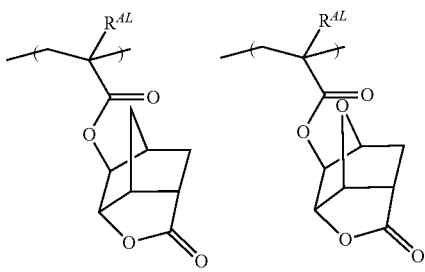

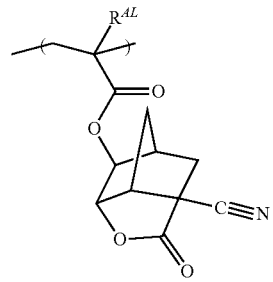

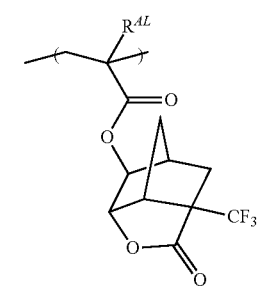

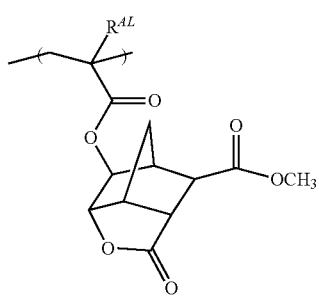

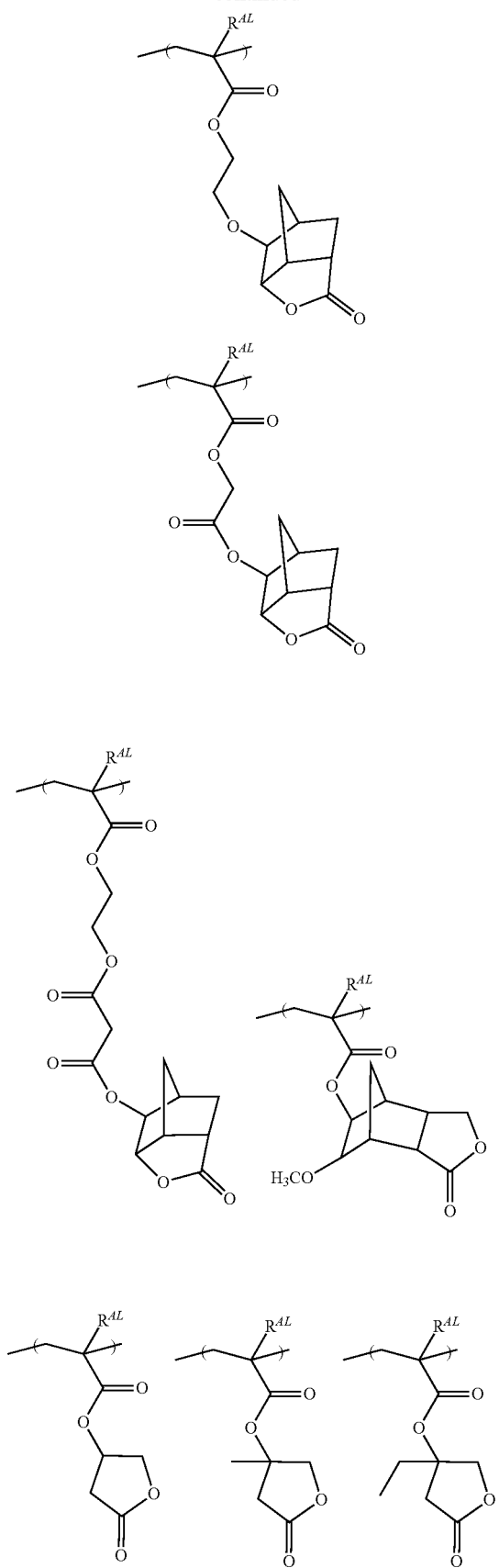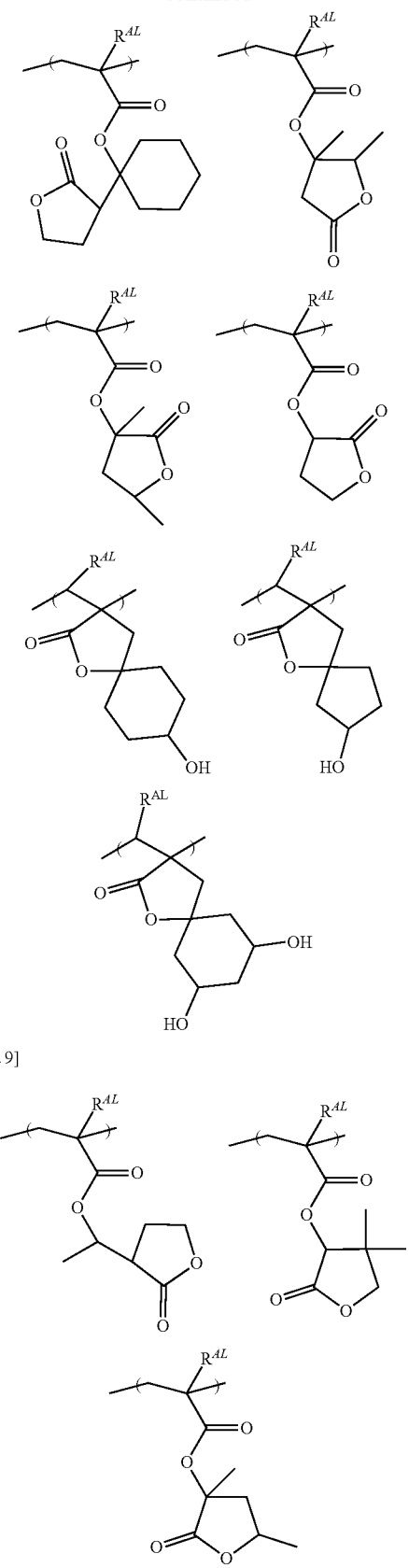
[Formula 9]

[Formula 10]
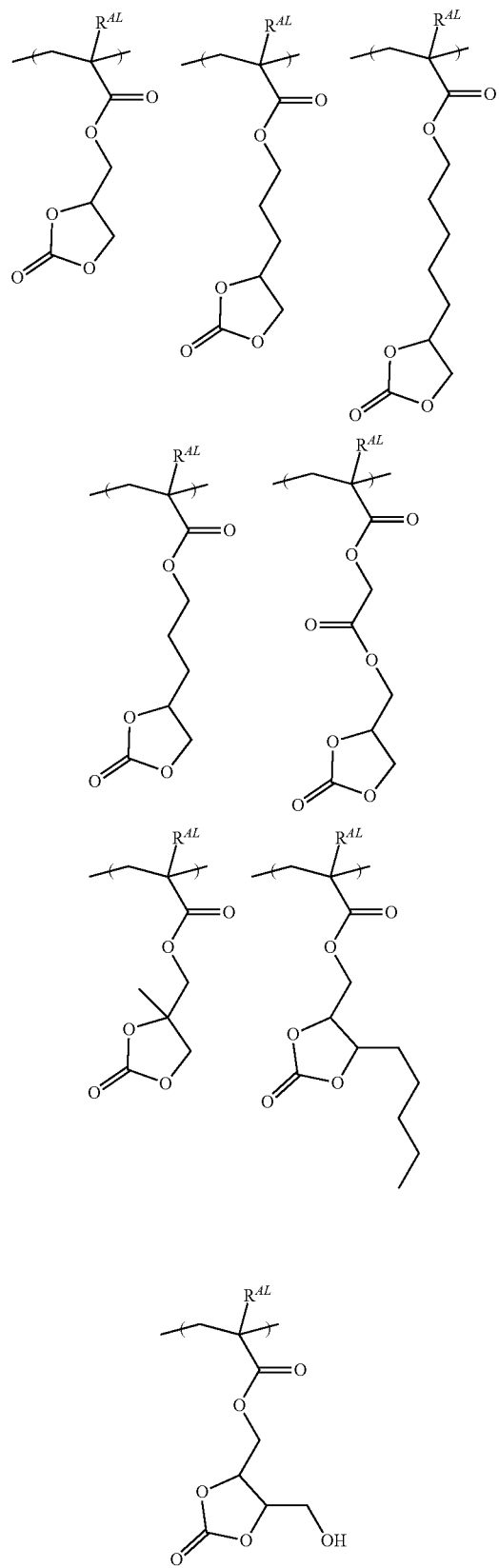
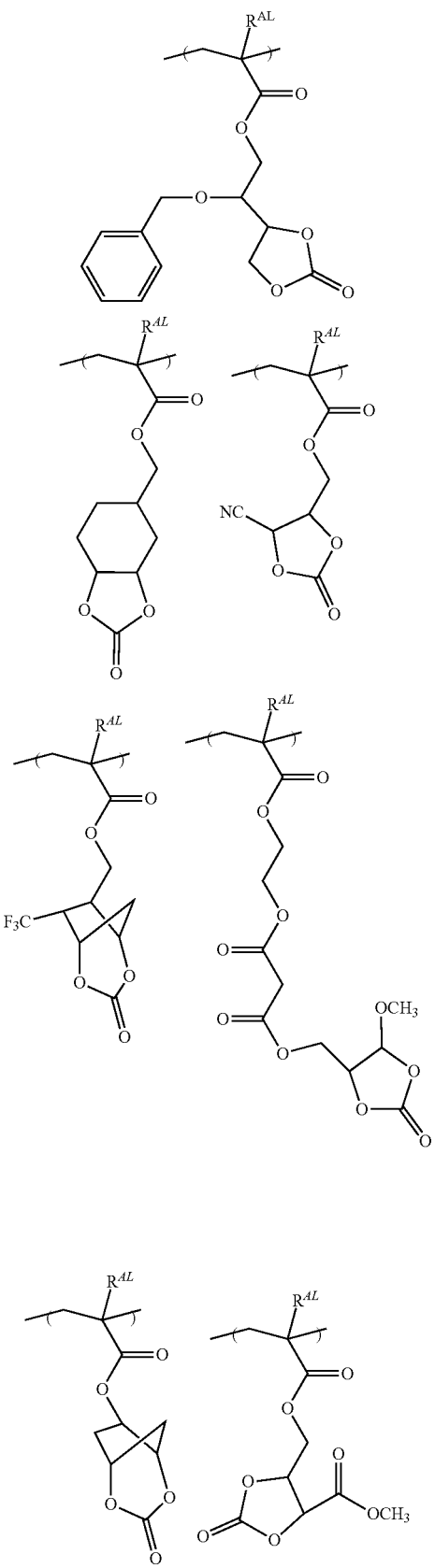

-continued

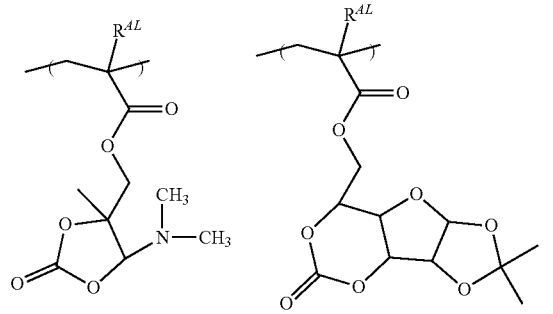

[Formula 11]

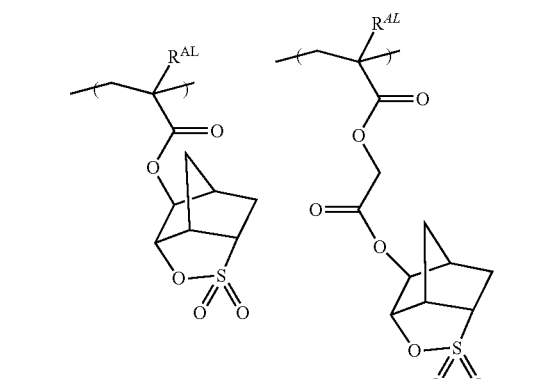

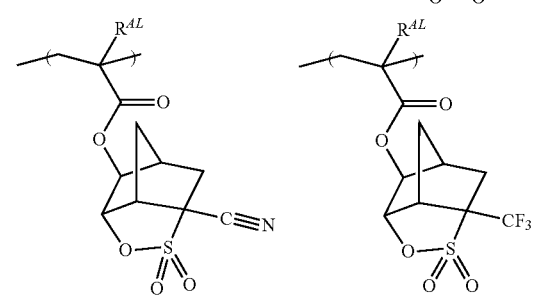

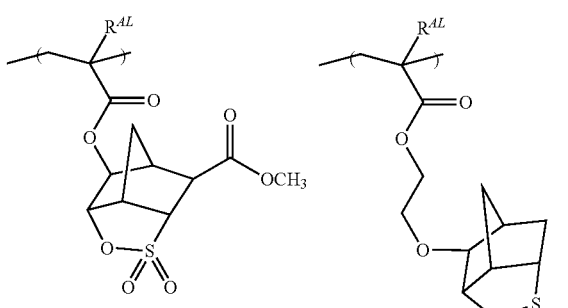

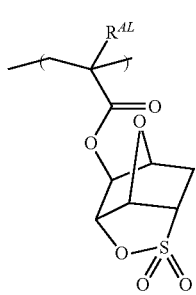

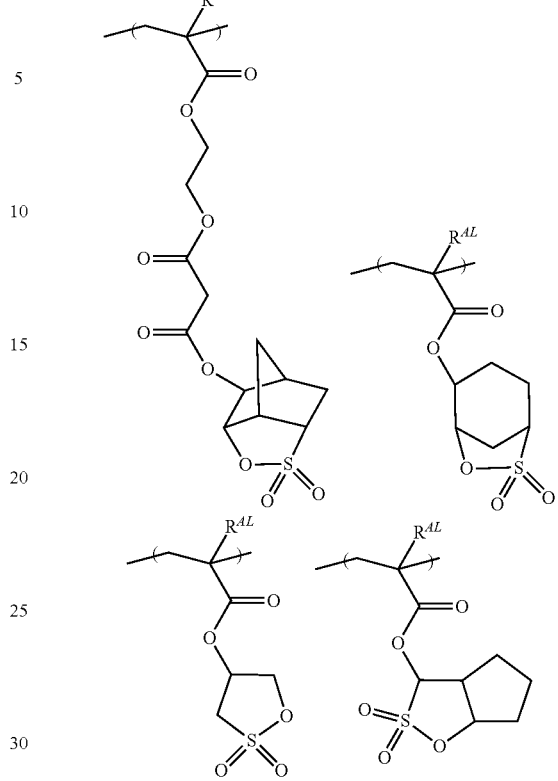

In the above formulas, $R^{AL}$ is a hydrogen atom, a fluorine atom, a methyl group, or a trifluoromethyl group.

As the $R^{AL}$, a hydrogen atom and a methyl group are preferable from the viewpoint of copolymerizability of a monomer that affords the structural unit (a3), and a methyl group is more preferable.

As the structural unit (a3), among these structural units, a structural unit containing a norbornanelactone structure, a structural unit containing an oxanorbornanelactone structure, a structural unit containing a γ-butyrolactone structure, a structural unit containing an ethylenecarbonate structure, and a structural unit containing a norbornanesultone structure are preferable. A structural unit derived from norbornanelactone-yl (meth)acrylate, a structural unit derived from oxanorbornanelactone-yl (meth)acrylate, a structural unit derived from cyano-substituted norbornanelactone-yl (meth)acrylate, a structural unit derived from norbornanelactone-yloxycarbonylmethyl (meth)acrylate, a structural unit derived from butyrolacton-3-yl (meth)acrylate, a structural unit derived from butyrolacton-4-yl (meth)acrylate, a structural unit derived from 3,5-dimethylbutyrolacton-3-yl (meth)acrylate, a structural unit derived from 4,5-dimethylbutyrolacton-4-yl (meth)acrylate, a structural unit derived from 1-(butyrolacton-3-yl)cyclohexan-1-yl (meth)acrylate, a structural unit derived from ethylenecarbonate-yl methyl (meth)acrylate, a structural unit derived from cyclohexenecarbonate-ylmethyl (meth)acrylate, a structural unit derived from norbornanesultone-yl (meth)acrylate, and a structural unit derived from norbornanesultone-yloxycarbonylmethyl (meth)acrylate are more preferable.

When the resin (A0) has a structural unit (a3), the lower limit of the content of the structural unit (a3) relative to all the structural units constituting the resin (A0) is preferably 1 mol %, more preferably 10 mol %, even more preferably 20 mol %, and particularly preferably 25 mol %. The upper limit of the content is preferably 70 mol %, more preferably 65 mol %, even more preferably 60 mol %, and particularly preferably 55 mol %. When the content is adjusted to within the above range, a resist pattern finer and superior in rectangularity of a cross-sectional shape can be formed.

[Structural Unit (a4)]

The resin (A0) may optionally have another structural unit (also referred to as structural unit (a4)) other than the structural units (a1) to (a3). Examples of the structural unit (a4) include structural units having a fluorine atom, an alcoholic hydroxyl group, a carboxy group, a cyano group, a nitro group, a sulfonamide group, or the like. Among them, a structural unit having a fluorine atom, a structural unit having an alcoholic hydroxyl group, and a structural unit having a carboxy group are preferable, and a structural unit having a fluorine atom and a structural unit having an alcoholic hydroxyl group are more preferable.

When the resin (A0) has a structural unit (a4), the lower limit of the content of the structural unit (a4) relative to all the structural units constituting the resin (A0) is preferably 1 mol %, more preferably 5 mol %, and even more preferably 10 mol %. The upper limit of the content is preferably 50 mol %, more preferably 40 mol %, and even more preferably 30 mol %. When the content of other structural units is adjusted to within the above range, the solubility of the resin (A0) in a developer can be made more appropriate. When the content of other structural units exceeds the above upper limit, the patternability may deteriorate.

In the resin (A0) of the present invention, for example, both (i) a repeating structure of hydroxystyrene obtained by polymerizing a hydroxystyrene monomer protected by an alkali-hydrolyzable group, followed by hydrolysis and (ii) a repeating structure obtained by polymerizing a hydroxystyrene monomer as it is, can correspond to the structural unit (a1). In addition, (iii) a repeating structure obtained by polymerizing a hydroxystyrene monomer in which a hydroxyl group is protected by a group dissociated by EUV or electron beam (EB) exposure can correspond to the above-described "structural unit (a2)".

The content of the resin (A0) is usually 85% by mass or more in the total solid content of the radiation-sensitive resin composition. The content is preferably 95% by mass or more, more preferably 99% by mass or more, even more preferably 99.9% by mass or more, and particularly preferably 99.99% by mass or more. Here, the "solid" refers to all components except the solvent (B) of the components contained in the radiation-sensitive resin composition.

(Method for Synthesizing Resin (A0))

The resin (A0) as a base resin can be synthesized by, for example, subjecting monomers that will afford structural units to a polymerization reaction in an appropriate solvent using a radical polymerization initiator or the like.

Examples of the radical polymerization initiator include azo radical initiators, such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile) and dimethyl 2,2'-azobisisobutyrate; and peroxide radical initiators, such as benzoyl peroxide, t-butyl hydroperoxide and cumene hydroperoxide. Among them, AIBN and dimethyl 2,2'-azobisisobutyrate are preferable, and AIBN is more preferable. These radical initiators can be used singly or in combination of two or more types thereof.

Examples of the solvent to be used in the polymerization reaction include alkanes, such as n-pentane, n-hexane, n-heptane, n-octane, n-nonane, and n-decane; cycloalkanes, such as cyclohexane, cycloheptane, cyclooctane, decalin, and norbornane; aromatic hydrocarbons, such as benzene, toluene, xylene, ethylbenzene, and cumene; halogenated hydrocarbons, such as chlorobutanes, bromohexanes, dichloroethanes, hexamethylene dibromide, and chlorobenzene; saturated carboxylic acid esters, such as ethyl acetate, n-butyl acetate, i-butyl acetate, and methyl propionate; ketones, such as acetone, methyl ethyl ketone, 4-methyl-2-pentanone, and 2-heptanone; ethers, such as tetrahydrofuran, dimethoxyethanes, and diethoxyethanes; and alcohols, such as methanol, ethanol, 1-propanol, 2-propanol, and 4-methyl-2-pentanol. The solvents to be used in the polymerization reaction may be used singly or in combination of two or more types thereof.

The reaction temperature in the polymerization reaction is usually 40° C. to 150° C., and preferably 50° C. to 120° C. The reaction time is usually 1 hour to 48 hours, and preferably 1 hour to 24 hours.

The molecular weight of the resin (A0) as a base resin is not particularly limited, and the weight average molecular weight (Mw) as determined by Gel Permeation Chromatography (GPC) relative to standard polystyrene is preferably 1,000 or more and 50,000 or less, more preferably 2,000 or more and 30,000 or less, even more preferably 3,000 or more and 15,000 or less, and particularly preferably 4,000 or more and 12,000 or less. When the Mw of the resin (A0) is less than the above lower limit, the heat resistance of a resulting resist film may be deteriorated. When the Mw of the resin (A0) exceeds the above upper limit, the developability of the resist film may be deteriorated.

The ratio (Mw/Mn) of Mw to the number average molecular weight (Mn) of the resin (A0) as a base resin as determined by GPC relative to standard polystyrene is usually 1 or more and 5 or less, preferably 1 or more and 3 or less, and more preferably 1 or more and 2 or less.

The Mw and the Mn of the resin in the present description are values measured using gel permeation chromatography (GPC) under the following conditions.

GPC column: two G2000HXL, one G3000HXL, one G4000HXL (all manufactured by Tosoh Corporation)

Column temperature: 40° C.

Elution solvent: tetrahydrofuran

Flow rate: 1.0 mL/min

Sample concentration: 1.0% by mass

Amount of sample injected: 100 µL

Detector: differential refractometer

Standard material: monodisperse polystyrene (Other Resins)

The radiation-sensitive resin composition of the present embodiment may contain a resin having a higher content by mass of fluorine atoms than the base resin as described above (hereinafter, also referred as a "high fluorine-containing resin") as other resin. When the radiation-sensitive resin composition contains the high fluorine-containing resin, the high fluorine-containing resin can be localized in the surface layer of a resist film compared to the base resin, and as a result, the state of the surface of the resist film and the component distribution in the resist film can be controlled to a desired state.

The high fluorine-containing resin preferably has, for example, a structural unit represented by the following formula (3) (hereinafter, also referred to as "structural unit (a5)").

[Formula 12]

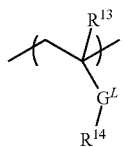

(3)

In the above formula (3), $R^{13}$ is a hydrogen atom, a methyl group, or a trifluoromethyl group. G is a single bond, an oxygen atom, a sulfur atom, —COO—, —SO$_2$ONH—, —CONH—, or —OCONH—. $R^{14}$ is a monovalent fluorinated chain hydrocarbon group having 1 to 20 carbon atoms or a monovalent fluorinated alicyclic hydrocarbon group having 3 to 20 carbon atoms.

As the $R^{13}$, a hydrogen atom and a methyl group are preferable from the viewpoint of the copolymerizability of a monomer that affords the structural unit (a5), and a methyl group is more preferable.

As the $G^L$, a single bond and —COO— are preferable from the viewpoint of the copolymerizability of a monomer that affords the structural unit (a5), and —COO— is more preferable.

Examples of the monovalent fluorinated chain hydrocarbon group having 1 to 20 carbon atoms represented by $R^{14}$ include groups in which some or all of the hydrogen atoms in the linear or branched chain alkyl group having 1 to 20 carbon atoms are substituted with fluorine atoms.

Examples of the monovalent fluorinated alicyclic hydrocarbon group having 3 to 20 carbon atoms represented by $R^{14}$ include monovalent fluorinated alicyclic hydrocarbon groups having 3 to 20 carbon atoms in which some or all of the hydrogen atoms of a mono- or polycyclic hydrocarbon group are substituted with fluorine atoms.

As the $R^{14}$, fluorinated chain hydrocarbon groups are preferable, fluorinated alkyl groups are more preferable, and 2,2,2-trifluoroethyl group, 1,1,1,3,3,3-hexafluoropropyl group, and 5,5,5-trifluoro-1,1-diethylpentyl group is even more preferable.

When the high fluorine-containing resin has the structural unit (a5), the lower limit of the content of the structural unit (a5) is preferably 10 mol %, more preferably 15 mol %, even more preferably 20 mol %, and particularly preferably 25 mol % based on all the structural units constituting the high fluorine-containing resin. The upper limit of the content is preferably 60 mol %, more preferably 50 mol %, and even more preferably 40 mol %. When the content of the structural unit (a5) is adjusted to within the above range, the content by mass of fluorine atoms in the high fluorine-containing resin can more appropriately be adjusted and the localization in the surface layer of a resist film can be further promoted.

The high fluorine-containing resin may have a fluorine atom-containing structural unit represented by the following formula (f-1) (hereinafter, also referred to as structural unit (a6)) in addition to the structural unit (a5). When the high fluorine-containing resin has the structural unit (f-1), solubility in an alkaline developer is improved, and the occurrence of development defects can be suppressed.

[Formula 13]

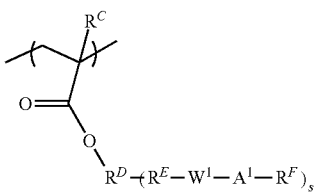

(f-1)

The structural unit (a6) is roughly divided into two cases: a case where it has (x) an alkali-soluble group, and a case where it has (y) a group that is dissociated by the action of an alkali to increase the solubility in an alkaline developer (hereinafter, also simply referred to as "alkali-dissociable group"). Commonly in (x) and (y), in the above formula (f-2), $R^C$ is a hydrogen atom, a fluorine atom, a methyl group, or a trifluoromethyl group. $R^D$ is a single bond, a hydrocarbon group having 1 to 20 carbon atoms with the valency of (s+1), a structure in which an oxygen atom, a sulfur atom, —NR$^{dd}$—, a carbonyl group, —COO— or —CONH— is connected to the terminal on $R^E$ side of the hydrocarbon group, or a structure in which some of the hydrogen atoms in the hydrocarbon group are substituted with organic groups having a hetero atom. $R^{dd}$ is a hydrogen atom or a monovalent hydrocarbon group having 1 to 10 carbon atoms. s is an integer of 1 to 3.

When the structural unit (a6) has (x) an alkali-soluble group, $R^F$ is a hydrogen atom, and $A^1$ is an oxygen atom, —COO—* or —SO$_2$O—*. * indicates a site that bonds to $R^F$. $W^1$ is a single bond, a hydrocarbon group having 1 to 20 carbon atoms, or a divalent fluorinated hydrocarbon group. When $A^1$ is an oxygen atom, $W^1$ is a fluorinated hydrocarbon group having a fluorine atom or a fluoroalkyl group on the carbon atom to which $A^1$ is bonded. $R^E$ is a single bond or a divalent organic group having 1 to 20 carbon atoms. When s is 2 or 3, the plurality of $R^E$s, $W^1$s, $A^1$s, and $R^F$S may be the same or different. When the structural unit (a6) has (x) an alkali-soluble group, affinity to an alkaline developer can be increased, and development defects can be suppressed. As the structural unit (a6) having (x) an alkali-soluble group, a case where $A^1$ is an oxygen atom and $W^1$ is a 1,1,1,3,3,3-hexafluoro-2,2-methanediyl group is particularly preferable.

When the structural unit (a6) has (y) an alkali-dissociable group, $R^F$ is a monovalent organic group having 1 to 30 carbon atoms, and $A^1$ is an oxygen atom, —NR$^{aa}$—, —COO—* or —SO$_2$O—*. $R^{aa}$ is a hydrogen atom or a monovalent hydrocarbon group having 1 to 10 carbon atoms. * indicates a site that bonds to $R^F$. $W^1$ is a single bond or a divalent fluorinated hydrocarbon group having 1 to 20 carbon atoms. $R^E$ is a single bond or a divalent organic group having 1 to 20 carbon atoms. When $A^1$ is —COO—* or —SO$_2$O—*, $W^1$ or $R^F$ has a fluorine atom on a carbon atom bonded to $A^1$ or on a carbon atom adjacent thereto. When $A^1$ is an oxygen atom, $W^1$ and $R^E$ are single bonds, $R^D$ is a structure in which a carbonyl group is bonded to a terminal on the $R^E$ side of a hydrocarbon group having 1 to 20 carbon atoms, and $R^F$ is an organic group having a fluorine atom. When s is 2 or 3, the plurality of $R^E$s, $W^1$s, $A^1$s, and $R^F$s may be the same or different. When the structural unit (a6) has (y) an alkali-dissociable group, the surface of a resist film changes from hydrophobic to hydrophilic in an alkali development step. As a result, the affinity to a developer can be greatly increased, and development defects can be more efficiently suppressed. As the structural unit (a6) having (y) an alkali-dissociable group, a structural unit in which $A^1$ is —COO—*, and $R^F$, $W^1$, or both of them have a fluorine atom is particularly preferable.

As the $R^C$, a hydrogen atom and a methyl group are preferable from the viewpoint of the copolymerizability of a monomer that affords the structural unit (a6), and a methyl group is more preferable.

When $R^E$ is a divalent organic group, a group having a lactone structure is preferable, a group having a polycyclic lactone structure is more preferable, and a group having a norbornanelactone structure is even more preferable.

When the high fluorine-containing resin has a structural unit (a6), the lower limit of the content of the structural unit (a6) is preferably 10 mol %, more preferably 20 mol %, even more preferably 30 mol %, and particularly preferably 35 mol % based on all the structural units constituting the high fluorine-containing resin. The upper limit of the content is preferably 90 mol %, more preferably 75 mol %, and even more preferably 60 mol %. When the content ratio of the structural unit (a6) is adjusted to within the above range, the water repellency of a resist film during immersion exposure can be further improved.

The lower limit of the Mw of the high fluorine-containing resin is preferably 1,000, more preferably 2,000, even more preferably 3,000, and particularly preferably 5,000. The upper limit of the Mw is preferably 50,000, more preferably 30,000, even more preferably 20,000, and particularly preferably 15,000.

The lower limit of Mw/Mn of the high fluorine-containing resin is usually 1, and preferably 1.1. The upper limit of the Mw/Mn is usually 5, preferably 3, more preferably 2, and even more preferably 1.7.

The lower limit of the content of the high fluorine-containing resin is preferably 0.1% by mass, more preferably 0.5% by mass, even more preferably 1% by mass, and still even more preferably 1.5% by mass, based on the total solid content in the radiation-sensitive resin composition. The upper limit of the content is preferably 20% by mass, more preferably 15% by mass, even more preferably 10% by mass, and particularly preferably 7% by mass.

The lower limit of the content of the high fluorine-containing resin is preferably 0.1 parts by mass, more preferably 0.5 parts by mass, even more preferably 1 part by mass, and particularly preferably 1.5 parts by mass, based on 100 parts by mass of the base resin. The upper limit of the content is preferably 15 parts by mass, more preferably 10 parts by mass, even more preferably 8 parts by mass, and particularly preferably 5 parts by mass.

When the content of the high fluorine-containing resin is adjusted to within the above range, the high fluorine-containing resin can be more effectively localized in the surface layer of a resist film, and as a result, the water repellency of the surface of the resist film during immersion exposure can be further enhanced. The radiation-sensitive resin composition may contain one type or two or more types of high fluorine-containing resins.

(Method for Synthesizing High Fluorine-Containing Resin)

The high fluorine-containing resin can be synthesized by the same method as the method for synthesizing a base resin described above.

(Solvent (B))

The radiation-sensitive resin composition contains a solvent. The solvent is not particularly limited as long as it is a solvent capable of dissolving or dispersing at least a resin, a radiation-sensitive acid generator, and optional components contained as desired.

Examples of the solvent include an alcohol-based solvent, an ether-based solvent, a ketone-based solvent, an amide-based solvent, an ester-based solvent, and a hydrocarbon-based solvent.

Examples of the alcohol-based solvent include:
monoalcohol-based solvents having 1 to 18 carbon atoms, such as iso-propanol, 4-methyl-2-pentanol, 3-methoxybutanol, n-hexanol, 2-ethylhexanol, furfuryl alcohol, cyclohexanol, 3,3,5-trimethylcyclohexanol, and diacetone alcohol;
polyhydric alcohol-based solvents having 2 to 18 carbon atoms, such as ethylene glycol, 1,2-propylene glycol, 2-methyl-2,4-pentanediol, 2,5-hexanediol, diethylene glycol, dipropylene glycol, triethylene glycol, and tripropylene glycol; and
partially etherized polyhydric alcohol-based solvents in which some of the hydroxy groups of the polyhydric alcohol-based solvent are etherized.

Examples of the ether-based solvent include:
dialkyl ether-based solvents, such as diethyl ether, dipropyl ether, and dibutyl ether;
cyclic ether-based solvents, such as tetrahydrofuran and tetrahydropyran;
aromatic ring-containing ether-based solvents, such as diphenyl ether and anisole (methyl phenyl ether); and
etherized polyhydric alcohol-based solvents in which the hydroxy groups of the polyhydric alcohol-based solvent are etherized.

Examples of the ketone-based solvent include chain ketone-based solvents, such as acetone, butanone, and methyl-iso-butyl ketone;
cyclic ketone-based solvents, such as cyclopentanone, cyclohexanone, and methylcyclohexanone; and
2,4-pentanedione, acetonylacetone, and acetophenone.

Examples of the amide-based solvent include cyclic amide-based solvents, such as N,N'-dimethylimidazolidinone and N-methylpyrrolidone; and
chain amide-based solvents, such as N-methylformamide, N,N-dimethylformamide, N,N-diethylformamide, acetamide, N-methylacetamide, N,N-dimethylacetamide, and N-methylpropionamide.

Examples of the ester-based solvent include:
monocarboxylic acid ester-based solvents, such as n-butyl acetate and ethyl lactate;
polyhydric alcohol partial ether acetate-based solvents, such as diethylene glycol mono-n-butyl ether acetate, propylene glycol monomethyl ether acetate, and dipropylene glycol monomethyl ether acetate;
lactone-based solvents, such as γ-butyrolactone and valerolactone;
carbonate-based solvents, such as diethyl carbonate, ethylene carbonate, and propylene carbonate; and
polyvalent carboxylic acid diester-based solvents, such as propylene glycol diacetate, methoxytriglycol acetate, diethyl oxalate, ethyl acetoacetate, ethyl lactate, and diethyl phthalate.

Examples of the hydrocarbon-based solvent include:
aliphatic hydrocarbon-based solvents, such as n-hexane, cyclohexane, and methylcyclohexane; and
aromatic hydrocarbon-based solvents, such as benzene, toluene, di-iso-propylbenzene, and n-amylnaphthalene.

Among them, ester-based solvents and ketone-based solvents are preferable, polyhydric alcohol partial ether acetate-based solvents, cyclic ketone-based solvents, and lactone-based solvents are more preferable, and propylene glycol monomethyl ether acetate, cyclohexanone, and γ-butyrolactone are even more preferable. The radiation-sensitive resin composition may contain one or two or more solvents.

((C) Radiation-Sensitive Acid Generator)

The radiation-sensitive resin composition of the present invention may contain a radiation-sensitive acid generator. As the radiation-sensitive acid generator (C), onium salt compounds are preferable, and sulfonium salt compounds and iodonium salts are more preferable. As such an onium salt compound, a known compound can be used.

In the present invention, when the radiation-sensitive resin composition (A) contains the radiation-sensitive acid generator (C), it is desirable that the amount of the radiation-sensitive acid generator (C) is smaller. For example, in the radiation-sensitive resin composition (A), the amount of the radiation-sensitive acid generator (C) is preferably 0.1% by mass or less, more preferably 0.05% by mass or less, and even more preferably 0.01% by mass or less based on the total amount of the components other than the solvent (B). The lower limit of the blending amount is, for example, 0.0001% by mass or 0.00001% by mass, and it is desirable that the radiation-sensitive acid generator (C) is not contained (0% by mass).

As described above, in the present invention, the presence of an acid during the exposure step or the occurrence of change in solubility or dissociation, such as elimination of the structural unit (a2) caused by an acid generated from a radiation-sensitive acid generator by exposure is not required. When the radiation-sensitive resin composition and the resist film of the present invention do not contain or are substantially free of the radiation-sensitive acid generator (C), uniformity is improved by simplifying the constituents of the resist film, or adverse effects on the interface between the exposed area and the unexposed area due to the acid generated during the exposure step are suppressed. As a result, various resist performances can be more reliably improved. Therefore, it is particularly desirable that the radiation-sensitive acid generator (C) is not contained or is substantially absent in the radiation-sensitive resin composition or the resist film of the present invention.

(Other Optional Components)

The radiation-sensitive resin composition may contain other optional components in addition to the components described above. Examples of the other optional components include an acid diffusion controlling agent, a crosslinking agent, a localization enhancing agent, a surfactant, an alicyclic skeleton-containing compound, and a sensitizer. Such other optional components may be used singly or in combination of two or more types thereof.

((D) Acid Diffusion Controlling Agent)

The radiation-sensitive resin composition may contain an acid diffusion controlling agent, as necessary. The acid diffusion controlling agent has the effect of controlling a phenomenon in which an acid generated from a radiation-sensitive acid generator by exposure diffuses in the resist film to suppress an undesired chemical reaction in an unexposed area. In addition, the storage stability of the resulting radiation-sensitive resin composition is improved. Furthermore, the resolution of a resist pattern is further improved, and it is possible to suppress a change in the line width of a resist pattern caused by a change in post-exposure delay, that is, the time between exposure and development, that is, it is possible to obtain a radiation-sensitive resin composition superior in process stability.

(Crosslinking Agent)

The crosslinking agent is a compound having two or more functional groups, and causes a crosslinking reaction in a polymer component by an acid catalytic reaction in a baking step after a one-shot exposure step to increase the molecular weight of the polymer component, thereby decreasing the solubility of a pattern-exposed area in a developer. Examples of the functional group include a (meth)acryloyl group, a hydroxymethyl group, an alkoxymethyl group, an epoxy group, and a vinyl ether group.

(Localization Enhancing Agent)

The localization enhancing agent is an agent having an effect of localizing the high fluorine-containing resin on the surface of a resist film more effectively. By including the localization enhancing agent in the radiation-sensitive resin composition, the amount of the high fluorine-containing resin added can be reduced as compared with conventional cases. Therefore, the localization enhancing agent can further suppress the elution of the ingredients of the radiation-sensitive resin composition from a resist film to an immersion medium and carry out the immersion exposure at higher speed with a high-speed scan, while maintaining the lithography performance of the radiation-sensitive resin composition. Examples of a compound that can be used as the localization enhancing agent includes low molecular weight compounds having a specific dielectric constant of not less than 30 and not more than 200 and a boiling point of 100° C. or higher at 1 atm. Specific examples of such a compound include lactone compounds, carbonate compounds, nitrile compounds, and polyhydric alcohols.

(Surfactant)

The surfactant exerts the effect of improving coatability, striation, developability, and the like. Examples of the surfactant include nonionic surfactants, including polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate. Examples of a commercially available surfactant include KP341 (manufactured by Shin-Etsu Chemical Co., Ltd.), POLYFLOW No. 75, POLYFLOW No. 95 (both manufactured by Kyoeisha Chemical Co., Ltd.), EFTOP EF301, EFTOP EF303, EFTOP EF352 (all manufactured by Tohkem Products Corporation), MEGAFACE F171, MEGAFACE F173 (both manufactured by DIC), Fluorad FC430, Fluorad FC431 (both manufactured by Sumitomo 3M Limited), ASAHIGUARD AG710, SURFLON S-382, SURFLON SC-101, SURFLON SC-102, SURFLON SC-103, SURFLON SC-104, SURFLON SC-105, SURFLON SC-106 (all manufactured by Asahi Glass Co., Ltd.) The content of the surfactant in the radiation-sensitive resin composition is usually 2 parts by mass or less based on 100 parts by mass of the resin.

(Alicyclic Skeleton-Containing Compound)

The alicyclic skeleton-containing compound exerts the effect of improving dry etching resistance, the shape of a pattern, adhesiveness to a substrate, and the like.

Examples of the alicyclic skeleton-containing compound include:

adamantane derivatives, including 1-adamantane carboxylic acid, 2-adamantanone, and t-butyl 1-adamantane carboxylate;

deoxycholic acid esters, including t-butyl deoxycholate, t-butoxycarbonylmethyl deoxycholate, and 2-ethoxyethyl deoxycholate;

lithocholic acid esters, including t-butyl lithocholate, t-butoxycarbonylmethyl lithocholate, and 2-ethoxyethyl lithocholate; and 3-[2-hydroxy-2,2-bis(trifluoromethyl)ethyl]tetracyclo [4.4.0.1(2,5) 0.1(7,10)]dode cane, and 2-hydroxy-9-methoxycarbonyl-5-oxo-4-oxa-tricyclo[4.2.1.0(3,7)] nonane. The content of the alicyclic skeleton-containing compound in the radiation-sensitive resin composition is usually 5 parts by mass or less based on 100 parts by mass of the resin.

(Sensitizer)

The sensitizer exhibits the action of increasing the amount of an acid generated from a radiation-sensitive acid generator or the like, and exerts the effect of improving the "apparent sensitivity" of the radiation-sensitive resin composition.

Examples of the sensitizer include carbazoles, acetophenones, benzophenones, naphthalenes, phenols, biacetyl, eosin, rose bengal, pyrenes, anthracenes, and phenothiazines. These sensitizers may be used singly or in combination of two or more of them. The content of the sensitizer in the radiation-sensitive resin composition is usually 2 parts by mass or less based on 100 parts by mass of the resin.

<Method for Preparing Radiation-Sensitive Resin Composition>

The radiation-sensitive resin composition (A) can be prepared, for example, by mixing the resin (A0) and the solvent (B), and as necessary, other components in a prescribed ratio. The radiation-sensitive resin composition is preferably filtered through, for example, a filter having a pore size of about 0.05 μm after mixing. The solid concentration of the radiation-sensitive resin composition is usually from 0.1% by mass to 50% by mass, preferably from 0.5% by mass to 30% by mass, and more preferably from 1% by mass to 20% by mass.

<Method for Forming Resist Pattern>

The method for forming a resist pattern according to the present invention includes:

step (1) of forming a resist film in which a content of a radiation-sensitive acid generator (C) is 0.1% by mass or less (hereinafter, also referred to as "resist film forming step");

step (2) of exposing the resist film to EUV or an electron beam (EB) (hereinafter, also referred to as "exposure step"); and step (3) of developing the resist film exposed in the step (2) (hereinafter, also referred to as "development step").

According to the method for forming a resist pattern, since a resist film or the like formed using the radiation-sensitive resin composition or the like and having a content of the radiation-sensitive acid generator (C) of 0.1% by mass or less is used, a resist pattern capable of exhibiting sensitivity and resolution in the exposure step at a superior level can be formed. Hereinbelow, each of the steps will be described.

[Resist Film Forming Step]

In this step (step (1)), a resist film is formed from the radiation-sensitive resin composition or the like. Examples of the substrate on which the resist film is formed include conventionally known substrates such as a silicon wafer, silicon dioxide, and a wafer coated with aluminum. An organic or inorganic antireflective film disclosed in, for example, JP-B-6-12452 or JP-A-59-93448 may be formed on the substrate. Examples of a method for applying the composition include spin coating, cast coating, and roll coating. After the application, prebaking (PB) may be performed to volatilize the solvent in the coating film, as necessary. The PB temperature is usually 60° C. to 140° C., and preferably 80° C. to 120° C. The PB time is usually 5 seconds to 600 seconds, and preferably 10 seconds to 300 seconds. The thickness of the resist film to be formed is preferably 10 nm to 1,000 nm, and more preferably 10 nm to 500 nm.

In the case of performing immersion exposure, regardless of the presence or absence of a water repellent polymer additive such as the high fluorine-containing resin in the radiation-sensitive resin composition, a protective film for immersion insoluble in an immersion medium may be provided on the formed resist film for the purpose of avoiding direct contact between the immersion medium and the resist film. As the protective film for immersion, either a solvent-removable protective film that is to be removed by a solvent before the development step (see, for example, JP-A-2006-227632) or a developer-removable protective film that is to be removed simultaneously with the development in the development step (see, for example, WO 2005-069076 and WO 2006-035790) may be used. However, from the viewpoint of throughput, it is preferable to use a developer-removable protective film for immersion.

When the subsequent exposure step is performed with radiation having a wavelength of 50 nm or less, it is preferable to use a resin having the structural unit (a1) and the structural unit (a2) as the base resin in the composition.

The step (1) is a step of forming a resist film in which the content of the radiation-sensitive acid generator (C) is 0.1% by mass or less, and the resist film can be formed using a known method. The resist film can be formed by using, for example, the above-described resin (A0) or the like. More specifically, for example, the resist film can be easily formed from a radiation-sensitive resin composition (A) in which the radiation-sensitive acid generator (C) accounts for 0.1% by mass or less based on the total amount of the components other than the solvent (B) in the radiation-sensitive resin composition (A). Alternatively, for example, the resist film can be easily formed from a radiation-sensitive resin composition (A) containing no radiation-sensitive acid generator.

In the resist film formed in the step (1), the content of the radiation-sensitive acid generator (C) is 0.1% by mass or less. When the radiation-sensitive acid generator (C) is contained in the resist film, the content of the radiation-sensitive acid generator (C) is desirably smaller. For example, the content of the radiation-sensitive acid generator (C) more preferably accounts for 0.05% by mass or less in the resist film, and in a more preferable example, the content of the radiation-sensitive acid generator (C) is 0.01% by mass or less. As to the lower limit of the blending amount, it is desirable that the radiation-sensitive acid generator (C) is not contained (0% by mass).

As described above, in the present invention, for example, the presence of an acid during the exposure step or the occurrence of change in solubility or dissociation, such as elimination of the structural unit (a2) caused by an acid generated from a radiation-sensitive acid generator by exposure is not required. When the resist film of the present invention does not contain or is substantially free of the radiation-sensitive acid generator (C), uniformity is improved by simplifying the constituents of the resist film, or adverse effects on the interface between the exposed area and the unexposed area due to the acid generated during the exposure step are suppressed. As a result, various resist performances can be more reliably improved. Therefore, it is particularly desirable that the radiation-sensitive acid generator (C) is not contained or substantially absent in the resist film in the present invention.

[Exposure Step]

In this step (the step (2)), the resist film formed in the resist film forming step, namely the step (1), is irradiated with radiation through a photomask (as the case may be, through an immersion medium such as water) to be exposed. Examples of the radiation to be used for exposure include extreme ultraviolet ray (EUV) and electron beam (EB) according to the line width of the intended pattern.

When the exposure is performed by immersion exposure, examples of the immersion medium to be used include water and a fluorine-based inert liquid. Preferably, the immersion medium is a liquid that is transparent to the exposure wavelength and has a temperature coefficient of refractive index as small as possible so as to minimize distortion of an optical image to be projected on the film. When water is used, an additive that reduces the surface tension of water and increases the surface activity may be added in a small proportion. This additive is preferably one that does not dissolve the resist film on a wafer and has negligible influence on an optical coating at an under surface of a lens. The water to be used is preferably distilled water.

In the present invention, as a result of the exposure, there is produced a difference in solubility in the developer between the exposed area and the unexposed area. In the present invention, since no or substantially no radiation-sensitive acid generator is contained, it is basically unnecessary to perform post exposure baking (PEB) after exposure for the purpose of promoting the dissociation of acid-dissociable groups of the resin or the like caused by an acid generated from a radiation-sensitive acid generator. However, in all embodiments of the present invention, it is not excluded to perform PEB as heating treatment after exposure for a purpose different from the purpose of generating an acid from a radiation-sensitive acid generator by exposure. The PEB temperature as the heating treatment is, for example, 50° C. to 180° C., and may be 80° C. to 130° C. The PEB time as the heating treatment is, for example, 5 seconds to 600 seconds, and may be 10 seconds to 300 seconds.

[Development Step]

In this step (the step (3)), the resist film exposed in the exposure step, namely the step (2), is developed. Thus, a prescribed resist pattern can be formed. In a common procedure, after the development, the film is washed with a rinsing liquid such as water or alcohol and dried.

In the step (3), in one embodiment, a negative tone pattern can be formed by development with an organic solvent.

In the step (3), in one embodiment, a positive tone pattern can be formed by development with an alkaline developer.

Examples of the developer to be used for the development include, in the alkaline development, an alkaline aqueous solution obtained by dissolving at least one alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, ethyldimethylamine, triethanolamine, tetramethyl ammonium hydroxide (TMAH), pyrrole, piperidine, choline, 1,8-diazabicyclo-[5.4.0]-7-undecene, and 1,5-diazabicyclo-[4.3.0]-5-nonene. Among them, an aqueous TMAH solution is preferable, and a 2.38% by mass aqueous TMAH solution is more preferable.

In the case of organic solvent development, examples of the solvent include organic solvents such as hydrocarbon-based solvents, ether-based solvents, ester-based solvents, ketone-based solvents, and alcohol-based solvents, and solvents containing an organic solvent. Examples of the organic solvent include one or two or more solvents among the solvents listed as the solvent for the radiation-sensitive resin composition. Among them, ester-based solvents and ketone-based solvents are preferable. As the ester-based solvents, acetate-based solvents are preferable, and n-butyl acetate and amyl acetate are more preferable. As the ketone-based solvents, chain ketones are preferable, and 2-heptanone is more preferable. The content of the organic solvent in the developer is preferably 80% by mass or more, more preferably 90% by mass or more, even more preferably 95% by mass, and particularly preferably 99% by mass. Examples of the components other than the organic solvent in the developer include water and silicon oil.

Examples of a development method include a method in which a substrate is immersed in a bath filled with a developer for a certain period of time (dipping method), a method in which a developer is allowed to be present on a surface of a substrate due to surface tension and to stand for a certain period of time (puddle method), a method in which a developer is sprayed onto a surface of a substrate (spray method), and a method in which a developer is discharged onto a substrate that is rotated at a constant speed while a developer discharge nozzle is scanned at a constant speed (dynamic dispensing method).

<Method for Processing Substrate, Method for Producing Metal Film Pattern>

The method for processing a substrate according to the present invention includes:

step (4-1) of forming a pattern on a substrate using a resist pattern formed by any of the methods described above as a mask.

A method for producing a metal film pattern according to the present invention includes:

step (4-2) of forming a metal film using a resist pattern formed by any of the methods described above as a mask.

Since in the above-described method for processing a substrate and the above-described method for producing a metal film pattern is used the above-described radiation-sensitive resin composition or the above-described resist film, they each can function as a resist film in a conventional exposure step or the like even though containing substantially no conventional radiation-sensitive acid generator (C), and the methods can process a high-quality substrate pattern and a high-quality metal film pattern, respectively.

The step (4-1) is a step of forming a pattern on a substrate using a resist pattern formed by any of the methods described above as a mask. Examples of a method of forming a pattern on a substrate using a resist pattern as a mask include: a method in which a resist pattern is formed on a substrate and then a pattern is formed by such a method as dry etching on the substrate in a portion with no resist; and a method in which a resist pattern is formed and then a part or the whole of a substrate is formed by vapor-depositing a constituent of the substrate by CVD or the like on a portion with no resist or by attaching metal there by such a method as electroless plating.

The step (4-2) is a step of forming a metal film using the resist pattern formed by any of the methods described above as a mask, and examples of the method of forming a metal film using the resist pattern as a mask include: a method in which a metal film is formed by forming a resist pattern and then vapor-depositing metal by such a method as electroless plating onto a portion with no resist; and a method in which a metal film is formed by forming a resist pattern on a metal film and then removing the metal film of a portion with no resist by such a method as dry etching.

EXAMPLES

Next, the present invention will specifically be described on the basis of examples, but is not limited to these examples. Methods for measuring various physical property values are described below.

[Measurement of Weight Average Molecular Weight (Mw), Number Average Molecular Weight (Mn), and Dispersity (Mw/Mn)]

The Mw and the Mn of the polymers used in examples were measured by gel permeation chromatography (GPC) with monodisperse polystyrene standards using GPC columns (G2000HXL×2, G3000HXL×1, and G4000HXL×1) manufactured by Tosoh Corporation, under analysis conditions including a flow rate: 1.0 mL/min, an elution solvent: tetrahydrofuran, a sample concentration: 1.0% by mass, an amount of sample injected: 100 μL, a column temperature: 40° C., and a detector: a differential refractometer. The dispersity (Mw/Mn) was calculated from the measurements of Mw and Mn.

<Synthesis of Polymer [A]>

The monomers used for the synthesis of the respective polymers in the respective Examples and Comparative Examples are shown below. In the following synthesis examples, unless otherwise specified, "parts by mass" means a value taken when the total mass of the monomers used is 100 parts by mass, and "mol %" means a value taken when the total number of moles of the monomers used is 100 mol %.

[Formula 14]

(M-1)

(M-2)

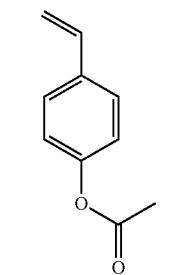

(M-3)

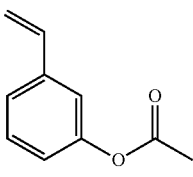

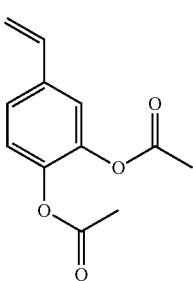

-continued (M-4)

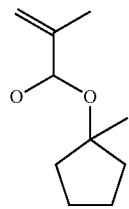

(M-5)

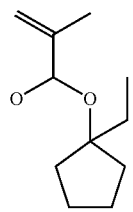

(M-6)

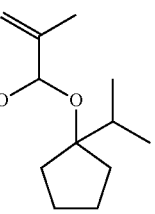

(M-7)

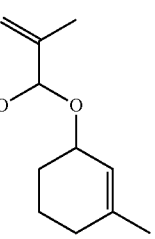

(M-8)

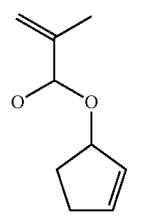

(M-9)

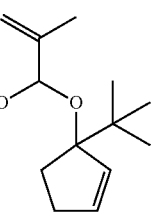

(M-10)

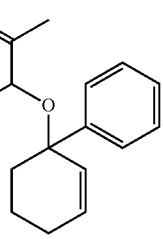

(M-11)
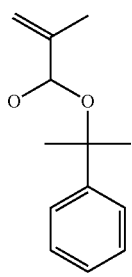

(M-12)
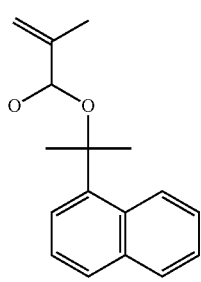

(M-13)
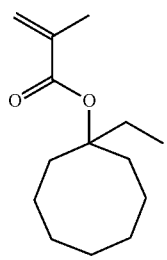

(M-14)
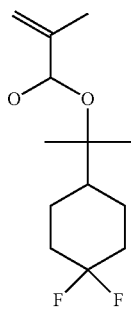

(M-15)
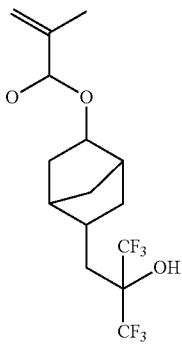

(M-16)
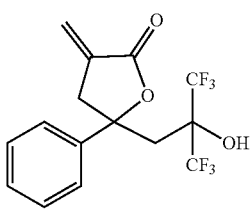

(M-17)
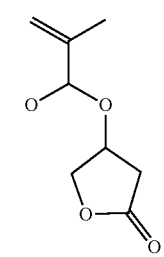

(M-18)
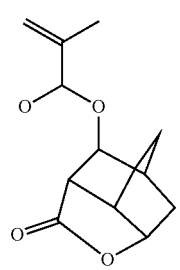

[Synthesis Example 1] (Synthesis of Polymer (A-1))

Compound (M-1) and compound (M-4) were dissolved in 1-methoxy-2-propanol (200 parts by mass based on the total amount of the monomers) so as to have a molar ratio of 40/60. Next, azobisisobutyronitrile was added as an initiator in an amount of 6 mol % based on all the monomers to prepare a monomer solution. On the other hand, 1-methoxy-2-propanol (100 parts by mass based on the total amount of monomers) was added to an empty reaction vessel, and was heated to 85° C. with stirring. Next, the monomer solution prepared above was added dropwise over 3 hours, and then the mixture was further heated at 85° C. for 3 hours to perform a polymerization reaction for 6 hours in total. After the polymerization reaction was completed, the polymerization solution was cooled to room temperature.

Thereafter, the cooled polymerization solution was charged into hexane (500 parts by mass based on the polymerization solution), and the precipitated white powder was collected by filtration. The white powder collected was washed twice with 100 parts by mass of hexane based on the polymerization solution, and then collected by filtration and dissolved in 1-methoxy-2-propanol (300 parts by mass). Next, methanol (500 parts by mass), triethylamine (50 parts by mass) and ultrapure water (10 parts by mass) were added, and a hydrolysis reaction was performed at 70° C. for 6 hours with stirring.

After the completion of the reaction, the remaining solvent was distilled off, and the resulting solid was dissolved in acetone (100 parts by mass). The solution was dropped into 500 parts by mass of water to solidify the resin, and the solid obtained was collected by filtration. By drying at 50° C. for 12 hours, a white powdery polymer (A-1) was synthesized.

The polymer (A-1) obtained had an Mw of 5,700 and an Mw/Mn of 1.61.

[Synthesis Examples 2 to 18] (Synthesis of Polymers (A-2) to (A-12))

Polymers (A-2) to (A-12) and (A-14) were synthesized by selecting monomers according to the formulation in Table 1 and performing the same operations as in Synthesis Example 1. The Mw and the Mw/Mn of the obtained polymers (A-2) to (A-12) are also shown in Table 1.

The formulation contents and the preparation results of each synthesis example are shown in Table 1 below.

[Formula 15]

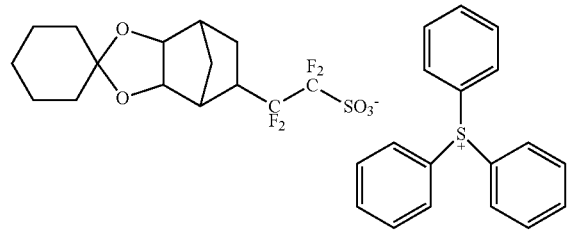

(C-1)

[Acid Diffusion Controlling Agent [D]]

The structural formula of the acid diffusion controlling agent is shown below.

[Formula 16]

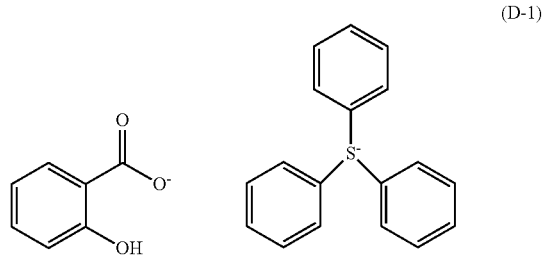

(D-1)

TABLE 1

| | | | Monomers to afford each structural unit | | | | | | | | | |
|---|---|---|---|---|---|---|---|---|---|---|---|---|
| | Polymer | Type | Use amount (mol %) | Structural unit content (mol %) | Type | Use amount (mol %) | Structural unit content (mol %) | Type | Use amount (mol %) | Structural unit content (mol %) | Mw | Mw/Mn |
| Synthesis Example 1 | A-1 | M-1[a] | 40 | 40.3 | M-4 | 60 | 59.7 | — | — | — | 5700 | 1.61 |
| Synthesis Example 2 | A-2 | M-1[a] | 40 | 41.3 | M-5 | 60 | 58.7 | — | — | — | 5800 | 1.64 |
| Synthesis Example 3 | A-3 | M-1[a] | 40 | 43.2 | M-6 | 60 | 56.8 | — | — | — | 6200 | 1.62 |
| Synthesis Example 4 | A-4 | M-1[a] | 40 | 39.8 | M-7 | 60 | 60.2 | — | — | — | 5500 | 1.54 |
| Synthesis Example 5 | A-5 | M-1[a] | 40 | 39.7 | M-8 | 60 | 60.3 | — | — | — | 5400 | 1.53 |
| Synthesis Example 6 | A-6 | M-1[a] | 40 | 45.3 | M-9 | 60 | 54.7 | — | — | — | 6000 | 1.67 |
| Synthesis Example 7 | A-7 | M-1[a] | 40 | 42.2 | M-10 | 60 | 57.8 | — | — | — | 6200 | 1.50 |
| Synthesis Example 8 | A-8 | M-1[a] | 40 | 42.5 | M-11 | 60 | 57.5 | — | — | — | 6100 | 1.55 |
| Synthesis Example 9 | A-9 | M-1[a] | 40 | 41.5 | M-12 | 60 | 58.5 | — | — | — | 5700 | 1.62 |
| Synthesis Example 10 | A-10 | M-1[a] | 40 | 45.2 | M-13 | 60 | 54.8 | — | — | — | 5500 | 1.61 |
| Synthesis Example 11 | A-11 | M-1[a] | 40 | 44.3 | M-14 | 60 | 55.7 | — | — | — | 6100 | 1.64 |
| Synthesis Example 12 | A-12 | M-1[a] | 20 | 19.2 | M-10 | 60 | 62.5 | — | — | — | 6100 | 1.53 |
| | | M-2[a] | 20 | 18.3 | | | | | | | | |
| Synthesis Example 13 | A-13 | M-2[a] | 40 | 40.2 | M-10 | 60 | 59.8 | — | — | — | 5800 | 1.59 |
| Synthesis Example 14 | A-14 | M-3[a] | 40 | 40.5 | M-10 | 60 | 59.5 | — | — | — | 5700 | 1.56 |
| Synthesis Example 15 | A-15 | M-1[a] | 20 | 19.3 | M-10 | 60 | 58.3 | M-15 | 20 | 22.4 | 6300 | 1.55 |
| Synthesis Example 16 | A-16 | M-1[a] | 20 | 19.4 | M-10 | 60 | 57.5 | M-16 | 20 | 23.1 | 6200 | 1.64 |
| Synthesis Example 17 | A-17 | M-1[a] | 20 | 19.1 | M-10 | 60 | 58.2 | M-17 | 20 | 22.7 | 5900 | 1.59 |
| Synthesis Example 18 | A-18 | M-1[a] | 20 | 18.9 | M-10 | 60 | 59.2 | M-18 | 20 | 21.9 | 6300 | 1.64 |

[a]Present as hydroxystyrene

<Preparation of Radiation-Sensitive Resin Composition>

The acid generator [C], the acid diffusion controlling agent [D], and the solvents [B] used for the preparation of the radiation-sensitive resin compositions of Examples and Comparative Examples are shown below.

[Acid Generator [C]]

The structural formula of the acid generator is shown below.

[Organic Solvent [B]]

The organic solvents are shown below.

B-1: propylene glycol monomethyl ether acetate
B-2: propylene glycol-1-monomethyl ether Example 1

A radiation-sensitive resin composition (R-1) was prepared by mixing 100 parts by mass of (A-1) as a polymer [A], 12,200 parts by mass of (B-1) as an organic solvent [B], and 5,200 parts by mass of (B-2), and then filtering the mixture through a 20 nm membrane filter.

[Examples 2 to 18 and Comparative Example 1]
(Radiation-Sensitive Resin Compositions (R-2) to (R-18) and (CR-1))

Radiation-sensitive resin compositions were prepared in the same manner as in Example 1 except that the types and blending amounts of components shown in the following Table 2 were used.

the sensitivity was 100 mJ/cm$^2$ or less, it was determined as "good", and when the sensitivity was more than 100 mJ/cm2, it was determined as "poor".

[Resolution]

At the optimum exposure amount, the dimension of the minimum resist pattern to be resolved when the size of the mask pattern forming a line-and-space (1L/1S) was varied was measured, and the measured value was defined as resolution (nm). The smaller the value, the better the resolution. When the resolution is less than 18 nm, it can be

TABLE 2

| | Radiation-sensitive resin composition | Resin | Parts by mass | Radiation-sensitive acid generator | Parts by mass | Acid diffusion controlling agent | mol % relative to radiation-sensitive acid generator | Solvent | Parts by mass |
|---|---|---|---|---|---|---|---|---|---|
| Example 1 | R-1 | A-1 | 100 | — | — | — | — | B-1/B-2 | 12200/5200 |
| Example 2 | R-2 | A-2 | 100 | — | — | — | — | B-1/B-2 | 12200/5200 |
| Example 3 | R-3 | A-3 | 100 | — | — | — | — | B-1/B-2 | 12200/5200 |
| Example 4 | R-4 | A-4 | 100 | — | — | — | — | B-1/B-2 | 12200/5200 |
| Example 5 | R-5 | A-5 | 100 | — | — | — | — | B-1/B-2 | 12200/5200 |
| Example 6 | R-6 | A-6 | 100 | — | — | — | — | B-1/B-2 | 12200/5200 |
| Example 7 | R-7 | A-7 | 100 | — | — | — | — | B-1/B-2 | 12200/5200 |
| Example 8 | R-8 | A-8 | 100 | — | — | — | — | B-1/B-2 | 12200/5200 |
| Example 9 | R-9 | A-9 | 100 | — | — | — | — | B-1/B-2 | 12200/5200 |
| Example 10 | R-10 | A-10 | 100 | — | — | — | — | B-1/B-2 | 12200/5200 |
| Example 11 | R-11 | A-11 | 100 | — | — | — | — | B-1/B-2 | 12200/5200 |
| Example 12 | R-12 | A-12 | 100 | — | — | — | — | B-1/B-2 | 12200/5200 |
| Example 13 | R-13 | A-13 | 100 | — | — | — | — | B-1/B-2 | 12200/5200 |
| Example 14 | R-14 | A-14 | 100 | — | — | — | — | B-1/B-2 | 12200/5200 |
| Example 15 | R-15 | A-15 | 100 | — | — | — | — | B-1/B-2 | 12200/5200 |
| Example 16 | R-16 | A-16 | 100 | — | — | — | — | B-1/B-2 | 12200/5200 |
| Example 17 | R-17 | A-17 | 100 | — | — | — | — | B-1/B-2 | 12200/5200 |
| Example 18 | R-18 | A-18 | 100 | — | — | — | — | B-1/B-2 | 12200/5200 |
| Comparative Example 1 | CR-1 | A-10 | 100 | C-1 | 36 | D-1 | 250 | B-1/B-2 | 12200/5200 |

[Formation of Resist Pattern by EUV Exposure and Alkaline Development]

Each of the radiation-sensitive resin compositions described in Table 2 was applied using a spin coater (CLEAN TRACK ACT12, manufactured by Tokyo Electron Ltd.) to a surface of a 12-inch silicon wafer with a 20 nm thick lower layer film (AL412, manufactured by Brewer Science) and then was subjected to prebaking (PB) at 100° C. for 60 seconds. Thereafter, cooling was performed at 23° C. for 30 seconds to form a resist film having a thickness of 20 nm.

Next, the resulting resist film was irradiated with EUV light using an EUV scanner (model "NXE3300", manufactured by ASML, NA=0.33, lighting condition: Dipole). After the irradiation, the resist film was developed at 23° C. for 30 seconds using a 2.38 wt % aqueous TMAH solution, then washed with water, and further dried to form a positive line-and-space resist pattern.

[Evaluation]

The sensitivity and resolution of each of the radiation-sensitive resin compositions were evaluated by measuring each of the formed resist patterns in accordance with the following methods. A scanning electron microscope ("CG-4100" manufactured by Hitachi High-Technologies Corporation) was used for measuring the length of the resist patterns. The evaluation results are shown in the following Table 3.

[Sensitivity]

An exposure amount at which an 18 nm line-and-space pattern was formed in the formation of the resist pattern was defined as an optimum exposure amount, and the optimum exposure amount was defined as sensitivity (mJ/cm$^2$). When evaluated as good, and when the resolution is 18 nm or more, it can be evaluated as poor.

The formation results of the respective resist patterns are shown in Table 3 below.

TABLE 3

| | Radiation-sensitive composition | Sensitivity (mJ/cm$^2$) | Resolution (nm) |
|---|---|---|---|
| Example 1 | R-1 | 98 | 17 |
| Example 2 | R-2 | 97 | 16 |
| Example 3 | R-3 | 95 | 16 |
| Example 4 | R-4 | 93 | 16 |
| Example 5 | R-5 | 95 | 16 |
| Example 6 | R-6 | 97 | 16 |
| Example 7 | R-7 | 88 | 15 |
| Example 8 | R-8 | 90 | 16 |
| Example 9 | R-9 | 92 | 16 |
| Example 10 | R-10 | 94 | 17 |
| Example 11 | R-11 | 95 | 17 |
| Example 12 | R-12 | 94 | 16 |
| Example 13 | R-13 | 95 | 15 |
| Example 14 | R-14 | 89 | 16 |
| Example 15 | R-15 | 90 | 15 |
| Example 16 | R-16 | 92 | 15 |
| Example 17 | R-17 | 93 | 15 |
| Example 18 | R-18 | 98 | 17 |
| Comparative Example 1 | CR-1 | 105 | 18 |

[Synthesis Example 19] (Synthesis of Polymer (A-19))

Compounds (M-5) and (M-13) were dissolved in 2-butanone (200 parts by mass) so as to have a molar ratio of 60/40 (mol %), and AIBN (azobisisobutyronitrile) (8 mol % based on 100 mol % in total of the monomers used) was added as an initiator to prepare a monomer solution. 2-Butanone (100 parts by mass) was placed in an empty reaction vessel and purged with nitrogen for 30 minutes. Then, the temperature inside the reaction vessel was adjusted to 80° C., and the monomer solution was added dropwise thereto over 3 hours with stirring. A polymerization reaction was performed for 6 hours with the start of the dropwise addition regarded as the start time of the polymerization reaction. After the completion of the polymerization reaction, the polymerization solution was cooled with water to 30° C. or lower. The polymerization solution cooled was poured into methanol (2,000 parts by mass), and a precipitated white powder was collected by filtration. The white powder collected was washed twice with methanol, collected by filtration, and dried at 50° C. for 10 hours, affording a white powdery polymer (A-19). The polymer (A-19) had an Mw of 5,700 and an Mw/Mn of 1.61. As a result of $^{13}$C-NMR analysis, the contents of the structural units derived from (M-5) and (M-13) were 58.5 mol % and 41.5 mol %, respectively.

[Synthesis Example 20] (Synthesis of Polymer (A-20))

Polymer (A-20) was synthesized by selecting monomers according to the formulation in Table 4 and performing the same operations as in Synthesis Example 1. The Mw and the Mw/Mn of the polymer (A-20) obtained are also shown in Table 4.

The formulation contents and the preparation results of each synthesis example are shown in Table 4 below.

and 5,200 parts by mass of (B-2), and then filtering the mixture through a 20 nm membrane filter.

[Example 20] (Radiation-Sensitive Resin Composition (R-20))

A radiation-sensitive resin composition was prepared in the same manner as in Example 19 except that the types and blending amounts of components shown in the following Table 5 were used.

TABLE 5

| | Radiation-sensitive composition | Resin | Parts by mass | Radiation-sensitive acid generator | Parts by mass | Acid diffusion control agent | mol % relative to radiation-sensitive acid generator | Solvent | Parts by mass |
|---|---|---|---|---|---|---|---|---|---|
| Example 19 | R-19 | A-19 | 100 | — | — | — | — | B-1/B-2 | 12200/5200 |
| Example 20 | R-20 | A-20 | 100 | — | — | — | — | B-1/B-2 | 12200/5200 |

[Formation of Resist Pattern by EUV Exposure and Alkaline Development]

A positive line-and-space resist pattern was formed in the same manner as described above using the radiation-sensitive resin composition (R-19) or (R-20).

[Evaluation]

The sensitivity and the resolution of each of the resist patterns formed were evaluated in the same manner as described above. The evaluation results are shown in Table 6 below.

TABLE 6

| | Radiation-sensitive composition | Sensitivity (mJ/cm$^2$) | Resolution (nm) |
|---|---|---|---|
| Example 19 | R-19 | 85 | 16 |
| Example 20 | R-20 | 81 | 17 |

As shown in Tables 3 and 6, the radiation-sensitive resin compositions in Examples exhibited good sensitivity and resolution in the exposure step. In contrast, the radiation-sensitive resin composition in Comparative Example was not good in the performances described above as compared with the results of Examples. As described above, it was revealed that the radiation-sensitive resin compositions of Examples of the present invention are superior in sensitivity and resolution.

TABLE 4

| | | | | Monomers to afford each structural unit | | | | | | | | |
|---|---|---|---|---|---|---|---|---|---|---|---|---|
| | Polymer | Type | Use amount (mol %) | Structural unit content (mol %) | Type | Use amount (mol %) | Structural unit content (mol %) | Type | Use amount (mol %) | Structural unit content (mol %) | Mw | Mw/Mn |
| Synthesis Example 19 | A-19 | — | — | — | M-5 | 60 | 58.5 | M-17 | 40 | 41.5 | 5700 | 1.61 |
| Synthesis Example 20 | A-20 | — | — | — | M-13 | 60 | 56.2 | M-17 | 40 | 43.8 | 5800 | 1.64 |

<Preparation of Radiation-Sensitive Resin Composition>

[Example 19] (Radiation-Sensitive Resin Composition (R-19))

A radiation-sensitive resin composition (R-19) was prepared by mixing 100 parts by mass of (A-19) as a polymer [A], 12,200 parts by mass of (B-1) as an organic solvent [B],

INDUSTRIAL APPLICABILITY

As described above, according to the radiation-sensitive resin composition, the method for forming a resist pattern, and the like of the present invention, it is possible to exhibit superior performance in sensitivity, resolution, and the like than the conventional. Therefore, the radiation-sensitive resin composition, the method for forming a resist pattern, and the like of the present invention can suitably be used for fine resist pattern formation and the like in the lithography step for various electronic devices such as semiconductor devices and liquid crystal devices.

The invention claimed is:

1. A method for forming a resist pattern, the method comprising:
   forming a resist film, the resist film optionally comprising a radiation-sensitive acid generator (C), a content of which in the resist film is 0.1% by mass or less based on a total amount of components of a radiation-sensitive resin composition other than the solvent;
   exposing the resist film to EUV or an electron beam (EB); and
   developing the resist film exposed.

2. The method according to claim 1, wherein the resist film is formed by applying the radiation-sensitive resin composition (A) directly or indirectly on a substrate, and the radiation-sensitive resin composition (A) comprises a resin (A1) whose solubility changes due to EUV or electron beam (EB) exposure in absence of a radiation-sensitive acid generator.

3. The method according to claim 1, wherein the resist film is formed by applying of the radiation-sensitive resin composition (A) directly or indirectly on a substrate, the radiation-sensitive resin composition (A) comprising: the solvent (B); and optionally the radiation-sensitive acid generator (C) which accounts for 0.1% by mass or less based on a total amount of components of the radiation-sensitive resin composition other than the solvent (B).

4. The method according to claim 1, wherein the resist film is formed by applying the radiation-sensitive resin composition (A) directly or indirectly on a substrate, and the radiation-sensitive resin composition (A) comprises no radiation-sensitive acid generator.

5. The method according to claim 2, wherein the resin (A1) changes to water-soluble or alkali-soluble due to EUV or electron beam (EB) exposure in absence of a radiation-sensitive acid generator.

6. The method according to claim 1, wherein in the developing of the resist film, the resist film is developed with an organic solvent to form a negative tone pattern.

7. The method according to claim 1, wherein in the developing of the resist film, the resist film is developed with an alkaline developer to form a positive tone pattern.

8. A method for processing a substrate, the method comprising forming a pattern on a substrate using the resist pattern formed by the method according to claim 1 as a mask.

9. A method for manufacturing a metal film pattern, the method comprising forming a patterned metal film using the resist pattern formed by the method according to claim 1 as a mask.

10. A radiation-sensitive resin composition comprising:
   (A2) a resin comprising a group that dissociates due to EUV or electron beam (EB) exposure;
   (B) a solvent; and
   (C) a radiation-sensitive acid generator,
   wherein in the radiation-sensitive resin composition, the radiation-sensitive acid generator (C) accounts for 0.1% by mass or less based on a total amount of components of the radiation-sensitive composition other than the solvent (B).

11. A radiation-sensitive resin composition consisting of:
   (A2) a resin comprising a group that dissociates due to EUV or electron beam (EB) exposure; and
   (B) a solvent.

12. The radiation-sensitive resin composition according to claim 10, wherein the resin (A2) dissociates due to EUV or electron beam (EB) exposure to form a carboxylic acid structure.

13. The radiation-sensitive resin composition according to claim 10, wherein the resin (A2) comprises a structural unit represented by formula (2):

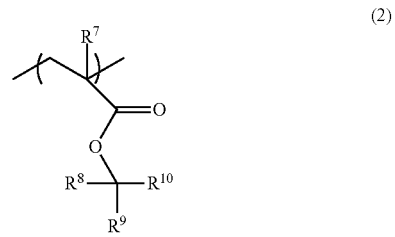

in the formula (2), $R^7$ is a hydrogen atom, a fluorine atom, a methyl group, or a trifluoromethyl group;
$R^8$ is a hydrogen atom or a monovalent hydrocarbon group having 1 to 20 carbon atoms;
$R^9$ and $R^{10}$ are each independently a monovalent chain hydrocarbon group having 1 to 20 carbon atoms which is substituted or unsubstituted with a fluorine atom, a monovalent alicyclic hydrocarbon group having 3 to 20 carbon atoms which is substituted or unsubstituted with a fluorine atom, or a monovalent aromatic hydrocarbon group having 5 to 20 carbon atoms, or taken together represent a divalent alicyclic group having 3 to 20 carbon atoms that is substituted or unsubstituted with a fluorine atom together with a carbon atom to which $R^9$ and $R^{10}$ are bonded;
any of $R^8$ to $R^{10}$ and/or the alicyclic group when present optionally have an unsaturated bond; and
two or more of $R^8$ to $R^{10}$ optionally form one alicyclic structure.

14. The radiation-sensitive resin composition according to claim 13, wherein $R^9$ and $R^{10}$ taken together represent a saturated or unsaturated divalent alicyclic group having 3 to 20 carbon atoms together with a carbon atom to which $R^9$ and $R^{10}$ are bonded.

15. The radiation-sensitive resin composition according to claim 13, wherein $R^8$ is a hydrogen atom, a monovalent alicyclic hydrocarbon group having 3 to 20 carbon atoms which is substituted or unsubstituted with a fluorine atom, or a monovalent aromatic hydrocarbon group having 5 to 20 carbon atoms.

16. The radiation-sensitive resin composition according to claim 10, wherein the resin (A2) comprises: a structural unit having a group that dissociates to form a carboxylic acid structure; and at least one structural unit selected from the group consisting of a structural unit having a phenolic hydroxyl group and a structural unit having a polar group.

17. The radiation-sensitive resin composition according to claim 16, wherein the structural unit having a polar group comprises at least one selected from the group consisting of a structural unit having an alcoholic hydroxyl group, a structural unit having a lactone structure, a structural unit having a cyclic carbonate structure, and a structural unit having a sultone structure.

* * * * *